(12) United States Patent
Maruyama et al.

(10) Patent No.: US 8,900,970 B2
(45) Date of Patent: Dec. 2, 2014

(54) METHOD FOR MANUFACTURING A SEMICONDUCTOR DEVICE USING A FLEXIBLE SUBSTRATE

(75) Inventors: Junya Maruyama, Kanagawa (JP); Yasuhiro Jinbo, Tokyo (JP); Hironobu Shoji, Tokyo (JP); Hideaki Kuwabara, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 398 days.

(21) Appl. No.: 11/735,009

(22) Filed: Apr. 13, 2007

(65) Prior Publication Data

US 2007/0254456 A1    Nov. 1, 2007

(30) Foreign Application Priority Data

Apr. 28, 2006 (JP) .................... 2006-126708

(51) Int. Cl.
| | | |
|---|---|---|
| H01L 21/30 | (2006.01) | |
| H01L 21/78 | (2006.01) | |
| H01L 51/00 | (2006.01) | |
| H01L 27/12 | (2006.01) | |
| H01L 23/64 | (2006.01) | |
| G06K 19/077 | (2006.01) | |
| H01L 23/66 | (2006.01) | |
| G02F 1/167 | (2006.01) | |
| H01L 23/498 | (2006.01) | |
| G02F 1/136 | (2006.01) | |

(52) U.S. Cl.
CPC .......... *H01L 21/7806* (2013.01); *H01L 51/003* (2013.01); *H01L 27/1214* (2013.01); *H01L 23/645* (2013.01); *H01L 2924/09701* (2013.01); *H01L 2924/12044* (2013.01); *G02F 1/167* (2013.01); *G06K 19/07749* (2013.01); *H01L 23/66* (2013.01); *H01L 51/0097* (2013.01); *H01L 23/49855* (2013.01); *H01L 2223/6677* (2013.01); *H01L 27/1266* (2013.01); *G02F 2001/13613* (2013.01); *H01L 2924/3011* (2013.01); *Y02E 10/549* (2013.01)
USPC ......................................... 438/458

(58) Field of Classification Search
CPC ..................... G06K 19/07749; H01L 21/7806; H01L 23/645; H01L 23/66; H01L 27/1214; H01L 27/1266; H01L 51/003; H01L 51/0097; H01L 23/49855; H01L 2223/6677; H01L 2924/09701; H01L 2924/12044; H01L 2924/301; G02F 1/167; Y02E 10/549
USPC ......................................... 438/458
See application file for complete search history.

(56) References Cited

U.S. PATENT DOCUMENTS

| | | |
|---|---|---|
| 5,757,456 A | 5/1998 | Yamazaki et al. |
| 5,821,138 A | 10/1998 | Yamazaki et al. |

(Continued)

FOREIGN PATENT DOCUMENTS

| | | |
|---|---|---|
| CN | 1397984 A | 2/2003 |
| EP | 1 351 308 A1 | 10/2003 |

(Continued)

OTHER PUBLICATIONS

Office Action (Application No. 200710100936.1) dated Feb. 5, 2010, 13 pages, English Translation.

(Continued)

*Primary Examiner* — Caleb Henry
(74) *Attorney, Agent, or Firm* — Fish & Richardson P.C.

(57) ABSTRACT

A technique for peeling an element manufactured through a process at relatively low temperature (lower than 500° C.) from a substrate and transferring the element to a flexible substrate (typically, a plastic film). With the use of an existing manufacturing device for a large glass substrate, a molybdenum film (Mo film) is formed over a glass substrate, an oxide film is formed over the molybdenum film, and an element is formed over the oxide film through a process at relatively low temperature (lower than 500° C.). Then, the element is peeled from the glass substrate and transferred to a flexible substrate.

38 Claims, 16 Drawing Sheets

(56) References Cited

U.S. PATENT DOCUMENTS

| | | |
|---|---|---|
| 6,127,199 A | 10/2000 | Inoue et al. |
| 6,180,438 B1 | 1/2001 | Deane et al. |
| 6,372,608 B1 | 4/2002 | Shimoda et al. |
| 6,645,830 B2 | 11/2003 | Shimoda et al. |
| 6,818,530 B2 | 11/2004 | Shimoda et al. |
| 6,953,735 B2 * | 10/2005 | Yamazaki et al. ............ 438/457 |
| 7,067,843 B2 | 6/2006 | Carcia et al. |
| 7,084,045 B2 * | 8/2006 | Takayama et al. ............ 438/455 |
| 7,091,070 B2 | 8/2006 | Imai et al. |
| 7,094,665 B2 | 8/2006 | Shimoda et al. |
| 7,122,445 B2 | 10/2006 | Takayama et al. |
| 7,229,862 B2 | 6/2007 | Yamazaki et al. |
| 7,241,666 B2 * | 7/2007 | Goto et al. ................... 438/455 |
| 7,341,924 B2 * | 3/2008 | Takayama et al. ............ 438/455 |
| 7,351,300 B2 | 4/2008 | Takayama et al. |
| 7,375,006 B2 | 5/2008 | Takayama et al. |
| 7,452,786 B2 | 11/2008 | Dozen et al. |
| 7,470,607 B2 | 12/2008 | Carcia et al. |
| 7,476,572 B2 | 1/2009 | Morisue et al. |
| 7,572,688 B2 | 8/2009 | Yamazaki et al. |
| 7,666,719 B2 | 2/2010 | Takayama et al. |
| 7,709,843 B2 | 5/2010 | Yamazaki et al. |
| 7,732,248 B2 | 6/2010 | Maekawa |
| 7,732,262 B2 | 6/2010 | Imai et al. |
| 7,825,002 B2 | 11/2010 | Takayama et al. |
| 7,939,385 B2 | 5/2011 | Dozen et al. |
| 8,227,294 B2 | 7/2012 | Maekawa |
| 8,236,629 B2 | 8/2012 | Dozen et al. |
| 8,338,198 B2 | 12/2012 | Takayama et al. |
| 8,445,901 B2 | 5/2013 | Maekawa |
| 2003/0032210 A1 | 2/2003 | Takayama et al. |
| 2003/0189216 A1 * | 10/2003 | Kamatani et al. ................ 257/98 |
| 2003/0217805 A1 | 11/2003 | Takayama et al. |
| 2005/0130391 A1 | 6/2005 | Takayama et al. |
| 2005/0167573 A1 | 8/2005 | Maruyama et al. |
| 2006/0030122 A1 | 2/2006 | Shimoda et al. |
| 2006/0183274 A1 | 8/2006 | Carcia et al. |
| 2007/0010067 A1 | 1/2007 | Shimoda et al. |
| 2007/0054436 A1 | 3/2007 | Hirakata et al. |
| 2007/0194379 A1 | 8/2007 | Hosono et al. |
| 2008/0042168 A1 | 2/2008 | Watanabe et al. |
| 2009/0239320 A1 | 9/2009 | Takayama et al. |
| 2009/0278122 A1 | 11/2009 | Hosono et al. |
| 2009/0280600 A1 | 11/2009 | Hosono et al. |
| 2011/0101352 A1 | 5/2011 | Hosono et al. |
| 2011/0201162 A1 | 8/2011 | Hosono et al. |
| 2012/0012838 A1 | 1/2012 | Hosono et al. |
| 2012/0217501 A1 | 8/2012 | Takayama et al. |

FOREIGN PATENT DOCUMENTS

| | | |
|---|---|---|
| EP | 1 383 165 A2 | 1/2004 |
| EP | 1 453 086 A2 | 9/2004 |
| EP | 0 858 110 B1 | 12/2006 |
| EP | 1737044 A1 | 12/2006 |
| EP | 2226847 A2 | 9/2010 |
| EP | 2246894 A1 | 11/2010 |
| EP | 2413366 A1 | 2/2012 |
| JP | 04-101424 A | 4/1992 |
| JP | 07-120789 A | 5/1995 |
| JP | 08-250745 | 9/1996 |
| JP | 08-288522 | 11/1996 |
| JP | 2001-517377 A | 10/2001 |
| JP | 2003-163338 A | 6/2003 |
| JP | 2003-174153 | 6/2003 |
| JP | 2005-150685 A | 6/2005 |
| JP | 2005-157323 A | 6/2005 |
| JP | 2005-197673 A | 7/2005 |
| JP | 2005-311335 A | 11/2005 |
| JP | 2005354035 A | 12/2005 |
| JP | 2005354036 A | 12/2005 |
| JP | 2006-013433 A | 1/2006 |
| JP | 2006-502589 A | 1/2006 |
| JP | 2006-049851 A | 2/2006 |
| JP | 2006-066899 A | 3/2006 |
| JP | 2006-100808 A | 4/2006 |
| JP | 2007-318105 A | 12/2007 |
| KR | 2004-0010186 A | 1/2004 |
| KR | 2004-0077536 A | 9/2004 |
| WO | 99/31720 A1 | 6/1999 |
| WO | 2004/034449 A1 | 4/2004 |
| WO | WO-2005/041310 | 5/2005 |
| WO | 2005088726 A1 | 9/2005 |
| WO | WO-2005/093813 | 10/2005 |
| WO | 2006/011665 A1 | 2/2006 |
| WO | WO-2006/025473 | 3/2006 |

OTHER PUBLICATIONS

Office Action, Korean Application No. 2012-0059023, dated Jul. 1, 2013, 9 pages with full English translation.

Office Action, Korean Application No. 2012-0059023, dated Jan. 24, 2014, 7 pages with full English translation.

* cited by examiner

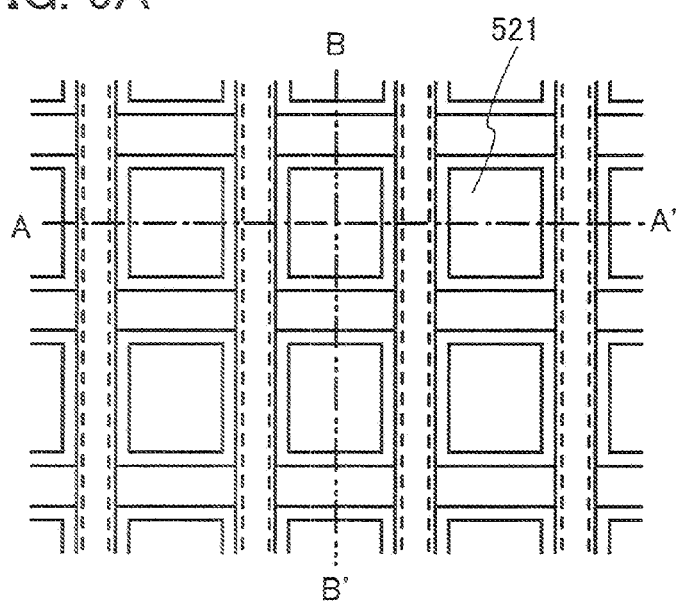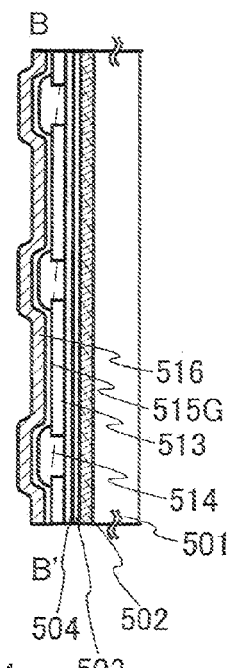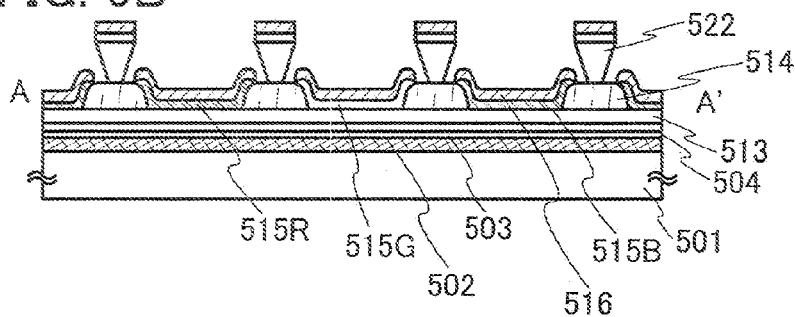

METHOD FOR MANUFACTURING A SEMICONDUCTOR DEVICE USING A FLEXIBLE SUBSTRATE

BACKGROUND OF THE INVENTION

1. Field of the Invention

The present invention relates to a semiconductor device which has a circuit including a thin film transistor (hereinafter referred to as a TFT) and a method for manufacturing the semiconductor device. For example, the present invention relates to an electronic device which has as a component an electro-optical device typified by a liquid crystal display panel or a light emitting display device including an organic light emitting element.

Note that the term "semiconductor device" in this specification refers to a device in general that can operate by utilizing semiconductor characteristics, and an electro-optical device, a semiconductor circuit, and an electronic device are all included in the semiconductor device.

2. Description of the Related Art

In recent years, attention has been focused on a technique for forming a thin film transistor (TFT) with the use of a semiconductor thin film (with a thickness of approximately several to several hundred nanometers) which is formed over a substrate having an insulating surface. The thin film transistor is widely applied to an electronic device such as an IC or an electro-optical device, and its development especially as a switching element of an image display device is rushed.

Various applications using such an image display device have been devised. In particular, application to a portable device has attracted attention. Currently, a glass substrate or a quartz substrate is often used; however, these substrates have the disadvantages of being fragile and heavy. Moreover, it is difficult to increase the size of a glass substrate or a quartz substrate, so that these substrates are unsuitable for mass production. Consequently, a TFT element is attempted to be formed over a substrate having flexibility, typically, a flexible plastic film.

Thus, several techniques have been proposed to peel an element formed over a glass substrate from the substrate and transfer the peeled element to another base material such as a plastic film.

The assignee of this application has proposed peeling and transferring techniques disclosed in References 1 and 2. Reference 1 discloses a peeling technique in which a silicon oxide film serving as a peeling layer is removed by wet etching. Reference 2 discloses a peeling technique in which a silicon film serving as a peeling layer is removed by dry etching.

In addition, the assignee of this application has proposed a peeling and transferring technique disclosed in Reference 3. Reference 3 discloses a peeling technique in which, when a metal layer (Ti, Al, Ta, W, Mo, Cu, Cr, Nd, Fe, Ni, Co, Ru, Rh, Pd, Os, Ir) is formed over a substrate and an oxide layer is stacked thereover, a metal oxide layer of the metal layer is formed at the interface between the metal layer and the oxide layer and this metal oxide layer is used for peeling in a later step.

[Reference 1] Japanese Published Patent Application No. H08-288522
[Reference 2] Japanese Published Patent Application No. H08-250745
[Reference 3] Japanese Published Patent Application No. 2003-174153

SUMMARY OF THE INVENTION

The present invention discloses a technique for separating (in other words, peeling) an element which is formed through a process at relatively low temperature (lower than 500° C.), typically a TFT using an amorphous silicon film or the like, a TFT using an organic semiconductor film, a light emitting element, or a passive element (such as a sensor, an antenna, a resistor, or a capacitor) from a glass substrate and disposing (in other words, transferring) the element to a flexible substrate (typically, a plastic film).

Although a TFT using an amorphous silicon film or the like or a TFT using an organic semiconductor film can be formed directly over a plastic film, a special manufacturing apparatus is required to handle a plastic film because of its softness. For mass production, a manufacturing apparatus which supplies a plastic film by a roll-to-roll method is needed.

In a case of forming a TFT using an amorphous silicon film or the like or a TFT using an organic semiconductor film directly over a plastic film, the plastic film may change its quality by exposure to a solvent or an etching gas used during the process of manufacturing the TFT. In a case of forming a TFT using ZnO directly over a plastic film, the plastic film changes its quality when exposed to plasma which is generated by a sputtering method or the like. Further, a plastic film may contaminate an element by absorbing or releasing moisture or the like during the process of manufacturing a TFT. Furthermore, a plastic film has lower heat resistance and is more significantly expanded and contracted due to heat as compared to a glass substrate, but it is difficult to finely control all treatment temperatures during the manufacturing process.

A feature of the present invention is to form a molybdenum film (Mo film) over a glass substrate and an oxide film over the molybdenum film; to form an element which is formed through a process at relatively low temperature (lower than 500° C.) (a TFT using an amorphous silicon film or the like, a TFT using an organic semiconductor film, a light emitting element, or a passive element (such as a sensor, an antenna, a resistor, or a capacitor)) over the oxide film; to peel the element from the glass substrate; and to transfer the element to a flexible substrate. Molybdenum has the disadvantage of being inferior in heat resistance to tungsten. For example, a molybdenum film causes peeling when subjected to heat treatment at 500° C. or higher; therefore, the temperature during the manufacturing process is preferably lower than 500° C. Further, a molybdenum film formed by a sputtering method is fragile, and is particularly fragile at the crystal grain boundary in a polycrystalline state. In the present invention, this molybdenum film having a fragile property is used to cause peeling. With the use of a molybdenum film having a fragile property, peeling can be performed with high yield even in a case of using a relatively large substrate.

In peeling an element including an organic compound (such as a light emitting element or an organic TFT) which is formed over a metal layer over a glass substrate, the element may be peeled not near the metal layer but in or at the interface of a layer including an organic compound because the organic compound has low adhesion, which may damage the element including an organic compound. A material layer formed by a printing method also has low adhesion; therefore, peeling may similarly occur in or at the interface of the material layer. However, in a case of employing a peeling method of the present invention in which a molybdenum film is used, peeling can be performed by weak force relative to other metals because a molybdenum film is fragile. Further, since heat treatment, laser light irradiation, or the like is not particularly necessary for the peeling, the process can be simplified.

In tape peel test in which peeling was performed by attaching tape immediately after formation of a silicon oxide film over a molybdenum film, peeling of the silicon oxide film could be confirmed. In other words, peeling can be performed without heat treatment. Note that FIG. 4A is a photograph showing a result of this tape peel test. FIG. 4B shows a schematic diagram of the photograph. Note that a sample shown in FIG. 4A was formed by stacking a silicon oxynitride film with a thickness of 100 nm over a glass substrate, a molybdenum film (with a thickness of 50 nm) thereover, and a silicon oxide film (200 nm) by a sputtering method. As shown in FIG. 4B, peeling with tape 1003 was confirmed in a region 1002. Note that a substrate 1001, over which a molybdenum film is formed entirely, has a mirror surface; therefore, the appearance of a ceiling (such as a hose) at the time of shooting is shown in the photograph of FIG. 4A. In addition, it was also confirmed that peeling could be performed even in a case of performing heat treatment as long as it is lower than 500° C.

From these test results and characteristics of a molybdenum film, it can be said that molybdenum is a more suitable material than other metals for peeling and transferring an element including an organic compound, or the like.

In addition, molybdenum has the advantages of having lower vapor pressure and releasing less gas than other metal elements. Therefore, contamination of an element formed over a molybdenum film can be minimized.

Although it is described that a molybdenum film is formed over a glass substrate, there is no limitation to a glass substrate, and a quartz substrate, a ceramic substrate, a semiconductor substrate, or the like can also be used.

According to the present invention, an element such as a TFT formed using an existing manufacturing apparatus for a large glass substrate can be transferred to a flexible substrate. Therefore, equipment cost can be significantly reduced.

One aspect of the present invention disclosed in this specification is a method of forming an element such as an amorphous TFT over a flexible substrate. A molybdenum film is formed over a substrate; a molybdenum oxide film is formed over the molybdenum film; an insulating film is formed over the molybdenum oxide film; a semiconductor film having an amorphous structure is formed over the insulating film; and the insulating film and the semiconductor film having an amorphous structure are peeled from the substrate and transferred to a flexible substrate.

An experiment was conducted as to whether or not a semiconductor film having an amorphous structure could be peeled without heat treatment.

A silicon oxynitride film with a thickness of 100 nm was formed over a glass substrate; a molybdenum film (with a thickness of 50 nm) was formed thereover; and a silicon oxide film (200 nm) was formed by a sputtering method. After that, a silicon oxynitride film with a thickness of 100 nm was formed by a PCVD method, and an amorphous silicon film (54 nm) was formed thereover. When tape was attached to and peeled from a part of an experiment substrate 1 formed as described above, the peeling could be performed as shown in FIG. 15A. As shown in FIG. 15B, which is a schematic diagram of FIG. 15A, peeling with tape could be confirmed in a region 1002. Note that a substrate 1001, over which the molybdenum film is formed entirely, has a mirror surface; therefore, the appearance of a ceiling (such as a hose) at the time of shooting is shown in the photograph of FIG. 15A. In tape peel test similarly conducted to an experiment substrate 2 to which heat treatment was performed, peeling could be performed as shown in FIG. 16A. As shown in FIG. 16B, which is a schematic diagram of FIG. 16A, peeling with tape could be confirmed in a region 1002.

A feature of the present invention is not to form an amorphous TFT by sequentially stacking material layers over a flexible substrate but to peel an element such as an amorphous TFT formed over a glass substrate, a ceramic substrate, or a quartz substrate from the substrate and fix the element to a flexible substrate. Note that treatment for fixing the element to the flexible substrate may be performed either before or after the peeling. Further, the element may be fixed between two flexible substrates.

Another aspect of the present invention is a method of forming an element such as an organic TFT over a flexible substrate. A molybdenum film is formed over a substrate; a molybdenum oxide film is formed over the molybdenum film; an insulating film is formed over the molybdenum oxide film; a semiconductor film including an organic compound is formed over the insulating film; and the insulating film and the semiconductor film including an organic compound are peeled from the substrate and transferred to a flexible substrate.

Still another aspect of the present invention is a method of forming a light emitting element such as an organic light emitting element or an inorganic light emitting element over a flexible substrate. A molybdenum film is formed over a substrate; a molybdenum oxide film is formed over the molybdenum film; an insulating film is formed over the molybdenum oxide film; a first electrode is formed over the insulating film; a light emitting layer including an organic compound or an inorganic compound is formed over the first electrode; a second electrode is formed over the light emitting layer; and the insulating film, the first electrode, the light emitting layer, and the second electrode are peeled from the substrate and transferred to a flexible substrate.

Yet another aspect of the present invention is a method of forming a passive element such as an antenna over a flexible substrate. A molybdenum film is formed over a substrate; a molybdenum oxide film is formed over the molybdenum film; an antenna is printed by a printing method over the molybdenum oxide film; the antenna is baked; an insulating film is formed to cover the antenna; and the insulating film and the antenna are peeled from the substrate and transferred to a flexible substrate.

According to the above aspect, the antenna is preferably formed in contact with the molybdenum oxide film. Since molybdenum oxide which is exposed after the peeling is a semiconductor, electrical connection can be obtained by placing a terminal portion of another element substrate to overlap a part of the antenna. In this case, the molybdenum oxide film is preferably thin and formed as a natural oxide film.

According to each of the above aspects, the molybdenum film is preferably formed in contact with the substrate because a process can be simplified. However, when the adhesion between the substrate and the molybdenum film is poor, a material film serving as a buffer layer (such as a silicon oxynitride film or a molybdenum nitride film) may be formed between the substrate and the molybdenum film.

According to each of the above aspects, pretreatment may be performed to promote the peeling, and for example, laser light irradiation is preferably performed partially before the peeling. Specifically, a solid-state laser (a pulse-excited Q-switch Nd:YAG laser) may be used, a second harmonic (532 nm) or a third harmonic (355 nm) of a fundamental wave may be used, and relatively weak laser light (with an irradiation energy of a laser light source of 1 mJ to 2 mJ) may be used for the irradiation.

The present invention can be applied regardless of an element structure, for example a TFT structure. For example, a top-gate TFT, a bottom-gate (inverted staggered) TFT, or a forward staggered TFT can be used. Further, there is no limitation to a single-gate transistor, and a multi-gate transistor having a plurality of channel formation regions, for example a double-gate transistor, may be used.

According to the present invention, a large display device using a flexible substrate can be manufactured, and not only a passive-matrix liquid crystal display device or a passive-matrix light emitting device but also an active-matrix liquid crystal display device or an active-matrix light emitting device can be manufactured.

Note that the term "molybdenum film" in this specification refers to a film which mainly contains molybdenum, and is not particularly limited as long as a composition ratio of molybdenum in the film is 50% or more. In order to increase mechanical strength of the film, Co, Sn, or the like may be added. A molybdenum film may also contain nitrogen in order to reduce its fragility.

The term "flexible substrate" refers to a plastic film substrate, for example a plastic substrate of polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like.

According to the present invention, a peeling step can be carried out smoothly even in a case of using a large substrate with a diagonal length of more than 1 m.

BRIEF DESCRIPTION OF DRAWINGS

FIG. 5A is a top view and FIGS. 5B and 5C are cross-sectional views of a passive-matrix light emitting device (Embodiment Mode 3).

DETAILED DESCRIPTION OF THE INVENTION

Embodiment modes and embodiments of the present invention will be described hereinafter.

Embodiment Mode 1

An example of manufacturing a liquid crystal display device is explained here with reference to FIGS. 1A to 1E.

First, a molybdenum film 102 is formed over a substrate 101. The substrate 101 used here is a glass substrate. The molybdenum film 102 is a molybdenum film formed by a sputtering method with a thickness of 30 nm to 200 nm. Since the substrate may be fixed for a sputtering method, the thickness of the molybdenum film on the edge portion of the substrate tends to be nonuniform. Therefore, the molybdenum film on the edge portion is preferably removed by dry etching.

Figure 1A:
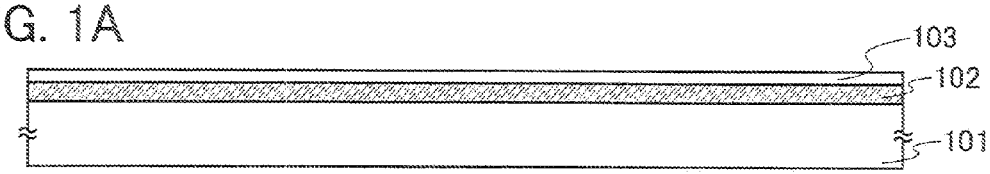
FIGS. 1A to 1E are cross-sectional views showing a manufacturing process of a liquid crystal display device (Embodiment Mode 1).

Next, a molybdenum oxide film 103 is formed by oxidation of a surface of the molybdenum film 102. The molybdenum oxide film 103 may be formed by oxidation of the surface with the use of pure water or ozone water or with the use of oxygen plasma. Alternatively, the molybdenum oxide film 103 may be formed by heating in an atmosphere including oxygen. FIG. 1A shows a cross-sectional view at a stage where the steps up to here are completed.

A first conductive film is formed over the molybdenum oxide film 103, and a mask is formed over the first conductive film. The first conductive film is formed using a single layer or a stacked layer of an element selected from Ta, W, Ti, Al, Cu, Cr, Nd, and the like, or an alloy material or a compound material mainly containing the element. The first conductive film is appropriately formed by a sputtering method, an evaporation method, a CVD method, a coating method, or the like. Next, a gate electrode 104 is formed by etching the first conductive film with the use of the mask.

Then, a first insulating film 105 functioning as a gate insulating film is formed over the gate electrode 104. The first insulating film 105 used here is an insulating film such as a silicon oxide film, a silicon nitride film, or a silicon oxynitride film. The first insulating film 105 may alternatively be a film obtained by applying and baking a solution including polysilazane or a siloxane polymer, a photo-curing organic resin film, a thermosetting organic resin film, or the like.

Next, a semiconductor film 106 having an amorphous structure is formed over the first insulating film 105. The semiconductor film 106 having an amorphous structure is formed using an amorphous semiconductor film or a microcrystalline semiconductor film produced by a vapor deposition method, a sputtering method, or a thermal CVD method using a semiconductor material gas typified by silane or germane. This embodiment mode describes an example of using an amorphous silicon film as the semiconductor film. The semiconductor film may be formed using ZnO or oxide of zinc gallium indium produced by a sputtering method or a pulsed laser deposition (PLD) method. In that case, the gate insulating film is preferably formed using oxide including aluminum or titanium.

Figure 1B:
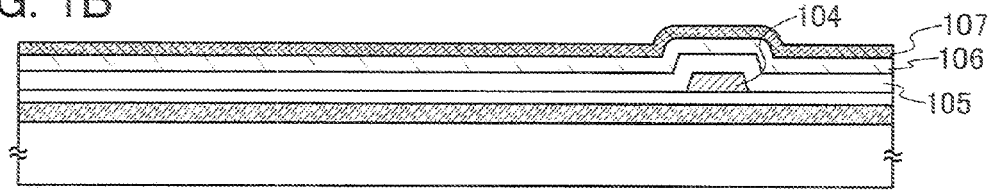

A semiconductor film containing an impurity element imparting one conductivity type is formed. Here, an amorphous semiconductor film 107 containing an impurity element imparting n-type conductivity is formed with a thickness of 20 nm to 80 nm. The amorphous semiconductor film 107 containing an impurity element imparting n-type conductivity is entirely formed by a plasma CVD method, a sputtering method, or the like. FIG. 1B shows a cross-sectional view at a stage where the steps up to here are completed.

Then, an island-like semiconductor layer and a conductive semiconductor layer are obtained by patterning using a photolithography technique. Note that instead of a photolithography technique, a mask may be formed by a droplet discharge method or a printing method (such as relief printing, planography, intaglio printing, or screen printing), and etching may be performed selectively.

After that, a source electrode 112 and a drain electrode 113 are formed by selectively discharging a composition including a conductive material (such as silver (Ag), gold (Au), copper (Cu), tungsten (W), or aluminum (Al)) by a droplet discharge method. Note that instead of a droplet discharge method, the source electrode 112 and the drain electrode 113 may be formed by forming a metal film (such as Ta, W, Ti, Al, Cu, Cr, or Nd) by a sputtering method and performing patterning using a photolithography technique.

Then, conductive semiconductor layers 110 and 111 are formed using the source electrode 112 and the drain electrode 113 as masks. A semiconductor layer 109 is formed by etching the upper semiconductor layer using the source electrode 112 and the drain electrode 113 as masks to expose a part of the lower semiconductor layer and by further removing a portion of an upper portion of the lower semiconductor layer. The exposed portion of the semiconductor layer 109 functions as a channel formation region of a TFT.

A protective film 114 is formed to prevent impurity contamination of the channel formation region of the semiconductor layer 109. The protective film 114 is formed using a material mainly containing silicon nitride or silicon nitride oxide by a sputtering method or a PCVD method. In this embodiment mode, hydrogenation treatment is carried out after the protective film is formed. In this manner, a TFT 108 is manufactured.

An interlayer insulating film 115 is formed over the protective film 114. The interlayer insulating film 115 is formed using a resin material such as an epoxy resin, an acrylic resin, a phenol resin, a novolac resin, a melamine resin, or a urethane resin. Alternatively, it may be formed using an organic material such as benzocyclobutene, parylene, or permeable polyimide, a compound material produced by polymerization of a siloxane-based polymer or the like, a composition material including a water-soluble homopolymer and a water-soluble copolymer, or the like. The interlayer insulating film 115 may be an insulating film such as a silicon oxide film, a silicon nitride film, or a silicon oxynitride film, or may be formed by stacking any of these insulating films and a resin material.

The protective film 114 and the interlayer insulating film 115 are selectively removed by patterning using a photolithography technique to form a contact hole reaching the drain electrode 113.

A first electrode 116 is formed by selectively discharging a composition including a conductive material (such as silver (Ag), gold (Au), copper (Cu), tungsten (W), or aluminum (Al)) by a droplet discharge method to be electrically connected to the drain electrode 113. A second electrode 117, which generates an electric field parallel to a substrate plane with the first electrode 116, is also formed by a droplet discharge method. Note that the first electrode 116 and the second electrode 117 are preferably positioned at a regular interval, and the shape of the electrode when seen from above may be pectinate.

Figure 1C:
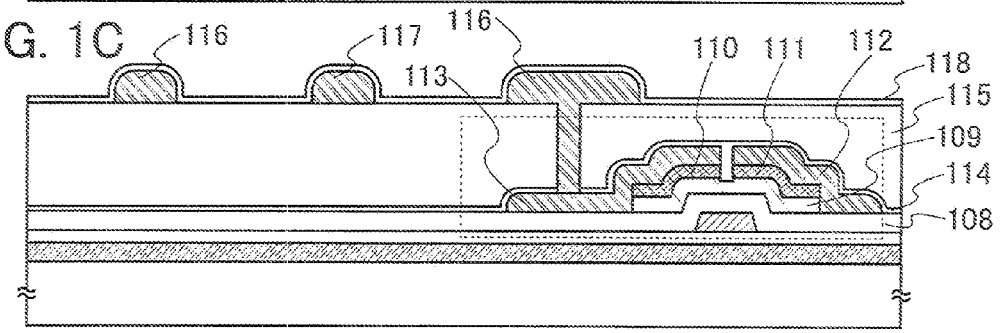

An orientation film 118 is formed to cover the first electrode 116 and the second electrode 117. FIG. 1C shows a cross-sectional view at a stage where the steps up to here are completed.

A flexible substrate 121 is fixed using a liquid crystal material, here a polymer dispersed liquid crystal, so as to face the substrate 101. The polymer dispersed liquid crystal can be roughly divided into two types depending on the dispersion state of liquid crystal and a polymer material. One of these two types is that in which droplets of liquid crystal are dispersed in a polymer material and liquid crystal is discontinuous (called PDLC). The other is that a polymer material forms a network in liquid crystal and liquid crystal is continuous (called PNLC). Note that although either type may be used in this embodiment mode, PDLC is used here. In this embodiment mode, a polymer material 119 including liquid crystal 120 fixes the flexible substrate 121. If necessary, a sealant may be provided to surround the polymer material 119. Further, if necessary, a spacer (such as a bead spacer, a column spacer, or a fiber) may be used to control the thickness of the polymer material 119.

Figure 1D:
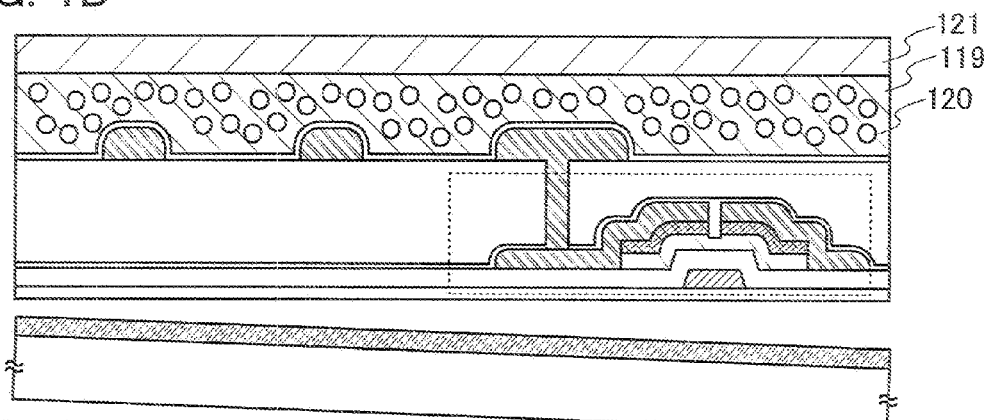

The TFT 108 and the flexible substrate 121 are peeled from the molybdenum film 102 and the substrate 101. The peeling can be performed by weak force relative to other metals because the molybdenum film is fragile. FIG. 1D is a diagram showing that separation occurs at the interface between the molybdenum oxide film 103 and the molybdenum film 102. However, separation may occur anywhere between the gate electrode 104 and the substrate 101 that does not destroy the TFT. Separation may be caused in the molybdenum film or the molybdenum oxide film, at the interface between the substrate and the molybdenum film, or at the interface between the gate electrode and the molybdenum oxide film. Note that in a case of manufacturing a transmissive liquid crystal display device, when separation is caused at the interface between the substrate and the molybdenum film and the molybdenum film remains, the molybdenum film is preferably removed later.

Figure 1E:
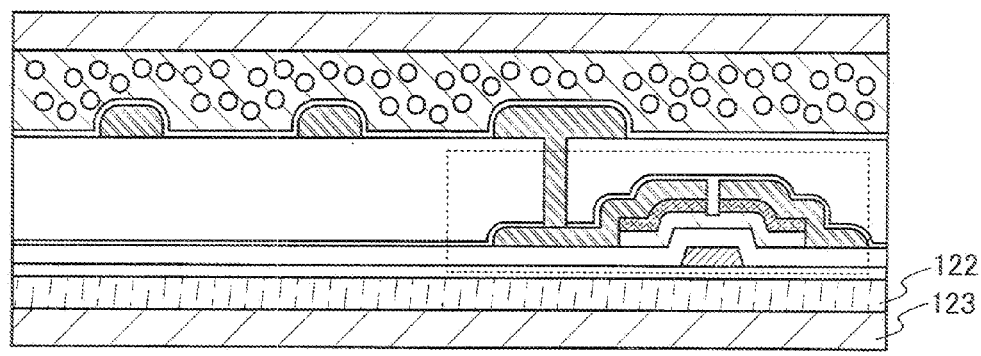

As shown in FIG. 1E, a flexible substrate 123 is fixed using an adhesive layer 122 to the side on which the peeling has been caused, in order to increase mechanical strength of a liquid crystal display device. Note that the flexible substrate 121 and the flexible substrate 123 are preferably formed using materials having the same thermal expansion coefficient in order to maintain a constant substrate interval independently of temperature change. If the liquid crystal display device has sufficient mechanical strength, the flexible substrate 123 may be omitted.

Through the above-described steps, an active-matrix liquid crystal display device using an amorphous-silicon TFT can be manufactured. A conductive film formed by a droplet discharge method has low adhesion. However, in a case of employing the peeling method of the present invention in which a molybdenum film is used, peeling can be performed near the molybdenum film (in this embodiment mode, at the interface between the molybdenum oxide film 103 and the molybdenum film 102) even when a conductive film formed by a droplet discharge method is used as a part of a wiring.

This embodiment mode describes an example of forming the gate electrode 104 on the molybdenum oxide film. When a terminal electrode is formed over the same layer and using the same material as the gate electrode on the periphery of a pixel portion, the terminal electrode can be connected to an external terminal such as an FPC through the molybdenum oxide film which also functions as a semiconductor material. In this case, electrical connection can be made by placing an FPC so as to overlap the terminal electrode after peeling.

Further in this case, external connection is achieved by providing not only a gate electrode but also a terminal electrode over the same layer and using the same material as the gate electrode separately, and connecting the terminal electrode to a source wiring, a common wiring, or a capacitor wiring. In addition, a driver IC may be connected to the terminal electrode through the molybdenum oxide film. After external connection is achieved as described above, sealing may be performed using another flexible substrate 123. Sealing with the flexible substrate 123 enables an FPC or an IC to be fixed more firmly.

Alternatively, an electrophoretic display may be manufactured using electronic ink instead of the polymer dispersed liquid crystal. In that case, after formation of the first electrode 116 and the second electrode 117, electronic ink may be applied by a printing method and then baked, and the flexible substrate 121 may be fixed. Then, the substrate may be peeled, and sealing may be performed using another flexible substrate.

Embodiment Mode 2

Described here with reference to FIGS. 2A to 2D is an example of manufacturing an active-matrix light emitting device using an organic TFT.

First, a molybdenum film 202 is formed over a substrate 201. The substrate 201 used here is a glass substrate. The molybdenum film 202 is a molybdenum film formed by a sputtering method with a thickness of 30 nm to 200 nm.

Next, a molybdenum oxide film 203 is formed by oxidation of a surface of the molybdenum film 202. The molybdenum oxide film 203 may be formed by oxidation of the surface with the use of pure water or ozone water or with the use of oxygen plasma. Alternatively, the molybdenum oxide film 203 may be formed by heating in an atmosphere including oxygen. Further alternatively, it may be formed in a later step of forming an insulating film. When a silicon oxide film or a silicon oxynitride film is formed as the insulating film by a plasma CVD method, the surface of the molybdenum film 202 is oxidized; accordingly, the molybdenum oxide film 203 is formed.

Figure 2A:
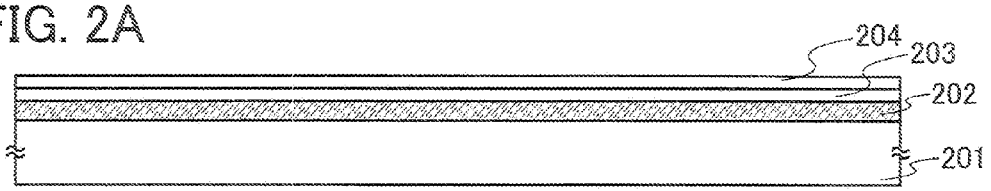
FIGS. 2A to 2D are cross-sectional views showing a manufacturing process of a light emitting device (Embodiment Mode 2).

Then, an insulating film 204 is formed over the molybdenum oxide film 203. The insulating film 204 is an insulating film such as a silicon oxide film, a silicon nitride film, or silicon oxynitride film ($SiO_xN_y$). A typical example of the insulating film 204 has a two-layer structure of a silicon nitride oxide film formed having a thickness of 50 nm to 100 nm by a PCVD method using $SiH_4$, $NH_3$, and $N_2O$ as reactive gases and a silicon oxynitride film formed having a thickness of 100 nm to 150 nm using $SiH_4$ and $N_2O$ as reactive gases. One layer of the insulating film 204 is preferably a silicon nitride film (SiN film) or a silicon nitride oxide film ($SiN_xO_y$ film (x>y)) having a thickness of 10 nm or less. Alternatively, a three-layer structure, in which a silicon nitride oxide film, a silicon oxynitride film, and a silicon nitride film are sequentially stacked, may be employed. Although the example of forming the insulating film 204 as a base insulating film is given here, the insulating film 204 may be omitted if not necessary. FIG. 2A shows a cross-sectional view at a stage where the steps up to here are completed.

A conductive layer serving as a gate electrode is formed over the insulating film 204. It is acceptable as long as a material used for the conductive layer is a metal to have an insulating property by being nitrided and/or oxidized. In particular, tantalum, niobium, aluminum, copper, or titanium is preferable. Further, tungsten, chromium, nickel, cobalt, magnesium, or the like can also be given as an example. There is no particular limitation on a method of forming the conductive layer. The conductive layer may be formed by forming a film by a sputtering method, an evaporation method, or the like and then processing the film into a desired shape by an etching method or the like. Alternatively, it may be formed by an ink-jet method or the like using droplets including a conductive material.

The conductive layer is then nitrided and/or oxidized to form a gate insulating film 212 of nitride, oxide, or oxynitride of the above-mentioned metal. Note that a part of the conductive layer other than the gate insulating film 212 which is obtained by insulating a part of the conductive layer functions as a gate electrode 211.

A semiconductor layer 213 is formed to cover the gate insulating film 212. An organic semiconductor material for forming the semiconductor layer 213 may be either a low-molecular or high-molecular organic material as long as it has a carrier transport property and possibly causes a change in carrier density by electric field effect. There is no particular limitation on kinds thereof. Examples are: a polycyclic aromatic compound, a conjugated double bond compound, a metal phthalocyanine complex, a charge-transfer complex, condensed ring tetracarboxylic acid diimides, oligothiophenes, fullerenes, carbon nanotube, and the like. It is possible to use, for example, polypyrrole, polythiophene, poly (3-alkylthiophene), polyphenylenevinylene, poly(p-phenylenevinylene), polyaniline, polydiacetylene, polyazulene, polypyrene, polycarbazole, polyselenophene, polyfuran, poly(p-phenylene), polyindole, polypyridazine, naphthacene, hexacene, heptacene, pyrene, chrysene, perylene, coronene, terrylene, ovalene, quaterrylene, circumanthracene, triphenodioxazine, triphenodithiazine, hexacene-6,15-quinone, polyvinylcarbazole, polyphenylenesulfide, polyvinylenesulfide, polyvinylpyridine, naphthalenetetracarboxylic acid diimide, anthracenetetracarboxylic acid diimide, C60, C70, C76, C78, C84, or a derivative thereof. In addition, specific examples thereof are: tetracene, pentacene, sexithiophene (6T), copper phthalocyanine, bis-(1,2,5-thiadiazolo)-p-quinobis(1,3-dithiole), rubrene, poly (2,5-thienylene vinylene) (PTV), poly(3-hexylthiophene-2, 5-diyl) (P3HT), are poly(9,9'-dioctylfluorene-co-bithiophene) (F8T2), which are generally referred to as p-type semiconductors; 7,7,8,8-tetracyanoquinodimethane (TCNQ), 3,4,9,10-perylenetetracarboxylic dianhydride (PTCDA), 1,4,5,8-naphthalenetetracarboxylic dianhydride (NTCDA), N,N'-dioctyl-3,4,9,10-perylenetetracarboxylic diimide (PTCDI-C8H), copper hexadecafluorophthalocyanine ($F_{16}CuPc$), N,N'-2,2,3,3,4,4,5,5,6,6,7,7,8,8,8-pentadecafluorooctyl-1,4,5,8-naphthalenetetracarboxylic diimide (NTCDI-C8F), 3',4'-dibutyl-5,5"-bis(dicyanomethylene)-5, 5"-dihydro-2,2':5',2"-terthiophene) (DCMT), and methanofullerene[6,6]-phenyl $C_{61}$ butyric acid methyl ester (PCBM), which are generally referred to as n-type semiconductors; and the like. Note that characteristics of a p-type or n-type organic semiconductor are not peculiar to the substance but depend on the relation with an electrode which injects carriers or the intensity of an electric field at the time of the injection. The semiconductor material can be used as either a p-type or n-type semiconductor, while it has a tendency to easily become one of them. Note that a p-type semiconductor is more preferable in this embodiment mode.

Films of these organic semiconductor materials can be formed by an evaporation method, a spin coating method, a droplet discharge method, or the like.

Then, a buffer layer 214 is formed over the semiconductor layer 213 to improve adhesion and interfacial chemical stability. The buffer layer 214 may be formed using a conductive organic material (an organic compound having an electron accepting property such as 7,7,8,8-tetracyanoquinodimethane (TCNQ) or 2,3,5,6-tetrafluoro-7,7,8,8-tetracyanoquinodimethane ($F_4$-TCNQ)) or a composite material of an organic compound and metal oxide. Note that the buffer layer 214 may be omitted if not necessary.

Conductive layers 215, one of which functions as a source electrode and the other as a drain electrode, are formed over the buffer layer 214. Although a material used for the conductive layers 215 is not particularly limited, a metal such as gold, platinum, aluminum, tungsten, titanium, copper, tantalum, niobium, chromium, nickel, cobalt, or magnesium or an alloy containing any of them can be used. Other examples of the material used for the conductive layers 215 are conductive high-molecular compounds such as polyaniline, polypyrrole, polythiophene, polyacetylene, and polydiacetylene, and the like. Note that a method of forming the conductive layers 215 is not particularly limited unless the semiconductor layer 213 is decomposed. The conductive layers 215 may be formed by forming a film by a sputtering method, an evaporation method, or the like and then processing the film into a desired shape by an etching method or the like. Alternatively, the conductive layers 215 may be formed by an ink-jet method using droplets including a conductive material. Through the above steps, an organic transistor 227 can be manufactured.

A film of an organic insulating material such as polyimide, polyamic acid, or polyvinyl phenyl may be formed in contact with a lower surface of the semiconductor layer 213. With such a structure, orientation of the organic semiconductor material can further be improved, and adhesion between the gate insulating film 212 and the semiconductor layer 213 can further be improved.

A method for manufacturing a light emitting device using the organic transistor 227 is described below.

An interlayer insulating film 228 is formed to cover the organic transistor 227. The interlayer insulating film 228 is selectively etched to form a contact hole reaching one of the conductive layers 215. A first electrode 210 is formed to be electrically connected to the one of the conductive layers 215. A partition 221 is formed to cover an end portion of the first electrode 210. The partition 221 is formed using an insulating material and functions to insulate between a plurality of first electrodes 210 adjacent to each other.

A light emitting layer 222 is formed over a region of the first electrode 210 which is not in contact with the partition 221. In many cases, the light emitting layer 222 is formed using a single layer or a stacked layer of an organic compound or a single layer or a stacked layer of an inorganic compound. However, in this specification, it is also considered that an inorganic compound is used for a part of a film made of an organic compound. There is no limitation on a stacking method of layers in a light emitting element. Any method that achieves stacking may be selected, such as a vacuum evaporation method, a spin coating method, an ink-jet method, or a dip coating method.

A second electrode 223 is formed over the light emitting layer 222. A portion in which the first electrode 210, the second electrode 223, and the light emitting layer 222 overlap each other constitutes a light emitting element. Note that this light emitting element includes an anode, a cathode, and a layer containing an organic compound or a layer containing an inorganic compound, which generates electroluminescence by application of an electric field (hereinafter referred to as an EL layer). An inorganic EL element using an inorganic thin film of ZnS:Mn or an organic EL element using an organic thin film formed by evaporation is particularly bright, shows high-efficiency electroluminescence, and is suitable for application to a display. Note that there is no particular limitation on the structure of the light emitting element.

Then, a protective film 224 is formed over the second electrode 223. Note that the protective film 224 may be omitted if not necessary.

Figure 2B:
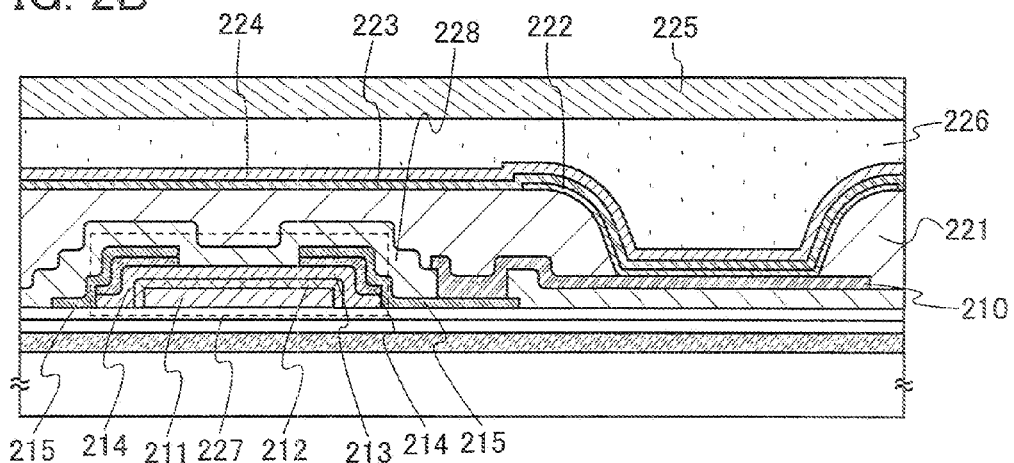

A flexible substrate 225 is fixed over the protective film 224 with an adhesive layer 226. A sealant may be provided to surround the adhesive layer 226 in order to strengthen sealing. FIG. 2B shows a cross-sectional view at a stage where the steps up to here are completed.

Figure 2C:
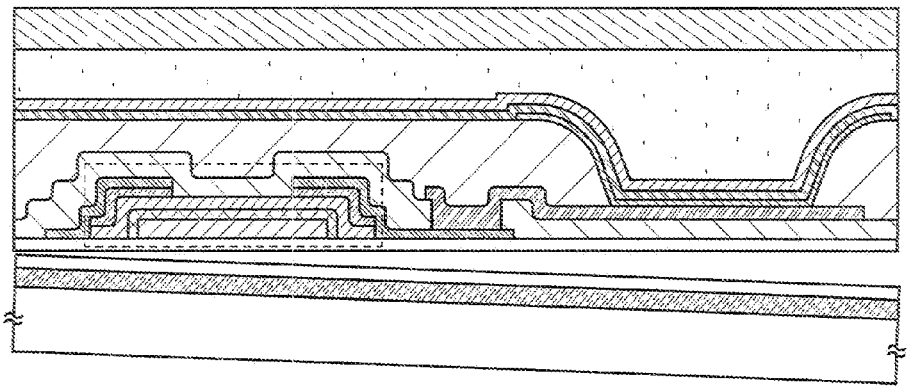

Next, the organic transistor 227 and the flexible substrate 225 are peeled from the molybdenum film 202, the molybdenum oxide film 203, and the substrate 201. FIG. 2C is a diagram showing that separation occurs at the interface between the molybdenum oxide film 203 and the insulating film 204.

Figure 2D:
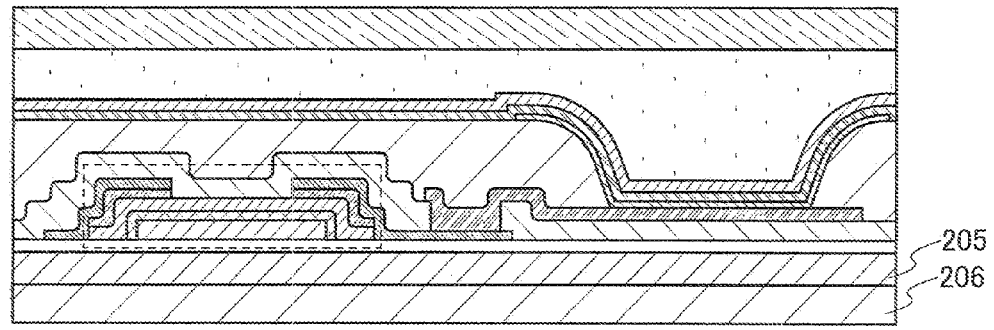

Then, as shown in FIG. 2D, a flexible substrate 206 is fixed using an adhesive layer 205 to the side on which the peeling has been caused, in order to increase mechanical strength of the light emitting device. If the light emitting device has sufficient mechanical strength, the flexible substrate 206 may be omitted.

Through the above-described steps, an active-matrix light emitting device using an organic transistor can be manufactured. For example, a light emitting layer formed by an evaporation method has low adhesion. However, in a case of employing the peeling method of the present invention in which a molybdenum film is used, peeling can be performed near the molybdenum film (in this embodiment mode, at the interface between the molybdenum oxide film 203 and the insulating film 204) even when a light emitting layer formed by an evaporation method is used.

Figure 3A:
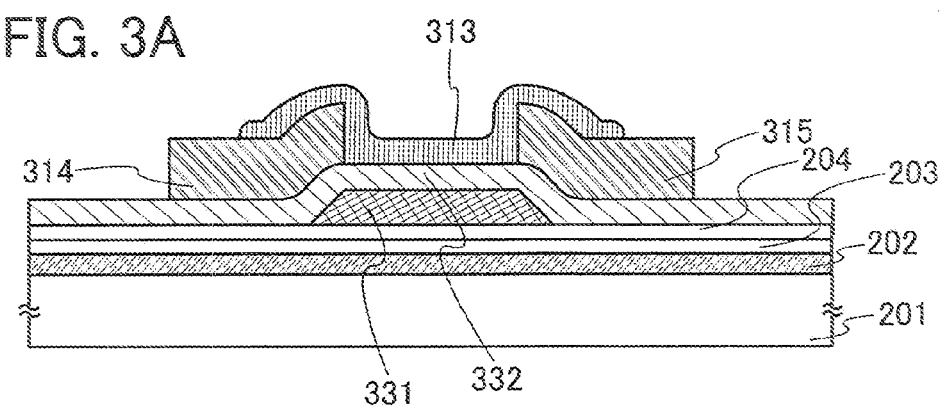
FIGS. 3A and 3B are diagrams each showing an example of a cross-sectional structure of an organic TFT (Embodiment Mode 2).
Figure 3B:
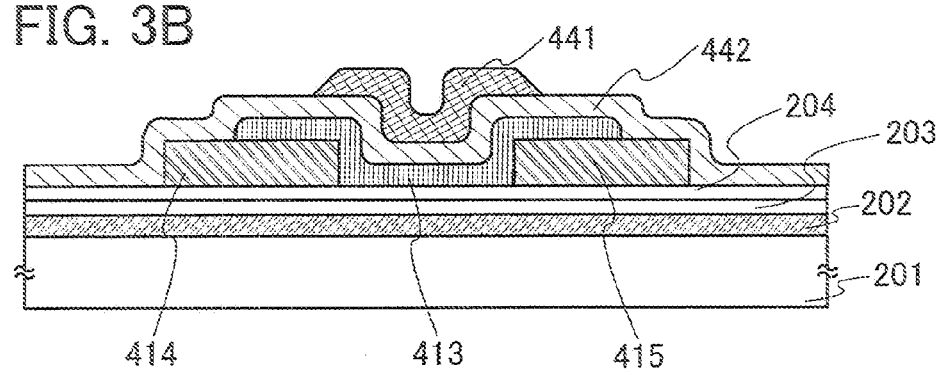
Figure 4A:
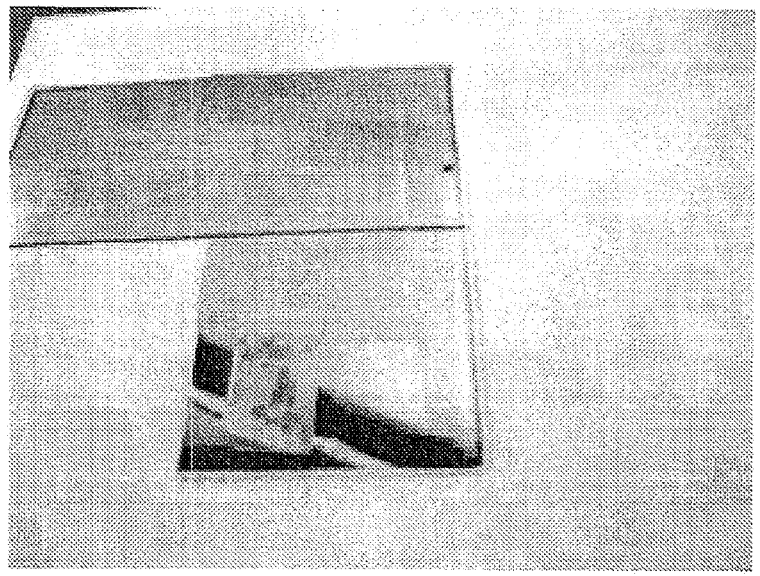
FIGS. 4A and 4B are a photograph and a schematic diagram showing results of a tape peel test, respectively.
Figure 4B:
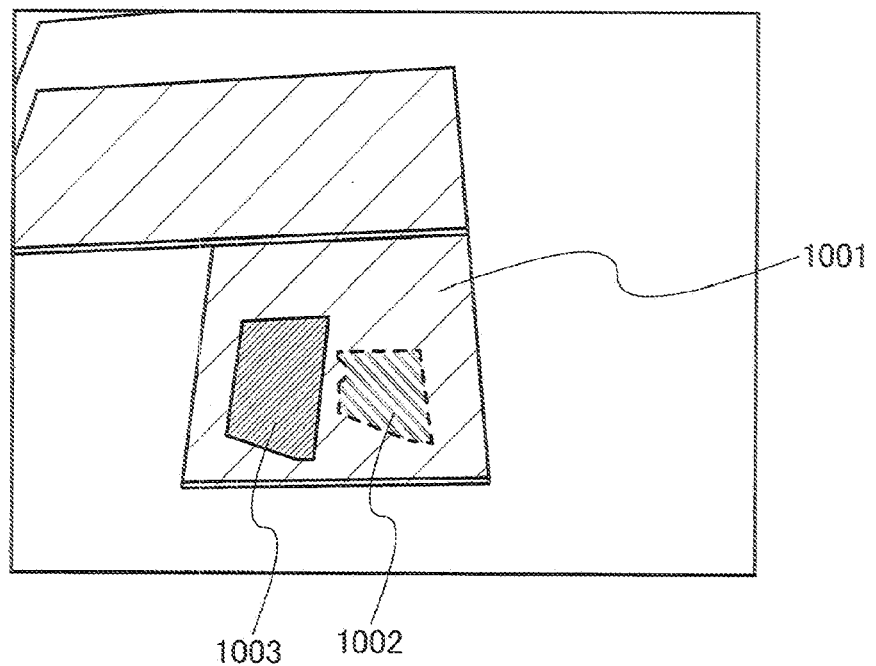

The structure of the organic transistor is not limited to that shown in FIG. 2C and may be that shown in FIG. 3A or 3B.

FIG. 3A shows a structure called a bottom-contact structure. Note that the same reference numeral is used to denote a part in common with FIGS. 2A to 2D. When the bottom-contact structure is employed, a step of photolithography or the like can easily be employed to perform microfabrication of a source wiring and a drain wiring. Therefore, the structure of the organic transistor may be selected appropriately in consideration of its advantage and disadvantage.

The molybdenum film 202, the molybdenum oxide film 203, and the insulating film 204 are stacked over the substrate 201. A gate electrode 331 is formed over the insulating film 204. There is no particular limitation on a material used for the gate electrode 331. An example is: a metal such as gold, platinum, aluminum, tungsten, titanium, copper, molybdenum, tantalum, niobium, chromium, nickel, cobalt, or magnesium; an alloy thereof; a conductive high-molecular compound such as polyaniline, polypyrrole, polythiophene, polyacetylene, or polydiacetylene; polysilicon doped with an impurity; or the like. There is no particular limitation on a method of forming the gate electrode 331. The gate electrode 331 may be formed by forming a film by a sputtering method, an evaporation method, or the like and then processing the film into a desired shape by an etching method or the like. Alternatively, it may be formed by an ink-jet method or the like using droplets including a conductive material.

Then, an insulating film 332 is formed to cover the gate electrode 331. The insulating film 332 is formed using an inorganic insulating material such as silicon oxide, silicon nitride, or silicon oxynitride. Note that the insulating film 332 can be formed by a coating method such as a dipping method, a spin coating method, or a droplet discharge method; a CVD method; a sputtering method; or the like. This insulating film 332 may be subjected to nitridation treatment and/or oxidation treatment using high-density plasma. High-density plasma nitridation can provide a silicon nitride film containing nitrogen at higher concentration. High-density plasma is generated using a high-frequency microwave, for example, 2.45 GHz. With the use of such high-density plasma, oxygen (or a gas including oxygen), nitrogen (or a gas including nitrogen), or the like is activated by plasma excitation and reacted with the insulating film. High-density plasma, a feature of which is low electron temperature, has low kinetic energy of active species; therefore, a film can be formed with less plasma damage and fewer defects as compared with a conventional plasma treatment. In addition, surface roughness of the insulating film 332 can be reduced by using high-density plasma, so that carrier mobility can be increased. Further, orientation of an organic semiconductor material used for forming a semiconductor layer over the insulating film 332 functioning as a gate insulating film can be improved.

Next, a source electrode 314 and a drain electrode 315 are formed over the insulating film 332. A semiconductor layer 313 is then formed between the source electrode 314 and the drain electrode 315. The semiconductor layer 313 can be formed using the same material as that of the semiconductor layer 213 shown in FIG. 2B. After an organic transistor having such a structure is formed, the organic transistor is peeled and transferred to a flexible substrate.

The structure of FIG. 3B is also described. FIG. 3B shows a structure called a top-gate structure. Note that the same reference numeral is used to denote a part in common with FIGS. 2A to 2D.

The molybdenum film 202, the molybdenum oxide film 203, and the insulating film 204 are stacked over the substrate 201. A source electrode 414 and a drain electrode 415 are formed over the insulating film 204. A semiconductor layer 413 is formed between the source electrode 414 and the drain electrode 415. An insulating film 442 is formed to cover the semiconductor layer 413, the source electrode 414, and the drain electrode 415. A gate electrode 441 is formed over the insulating film 442. The gate electrode 441 overlaps the semiconductor layer 413 with the insulating film 442 interposed therebetween. After an organic transistor having such a structure is formed, the organic transistor is peeled and transferred to a flexible substrate.

Thus, even organic transistors having various structures can be peeled and transferred to a flexible substrate according to the present invention. For example, a semiconductor layer formed by a coating method has low adhesion. However, in a case of employing the peeling method of the present invention in which a molybdenum film is used, peeling can be performed near the molybdenum film (in this embodiment mode, at the interface between the molybdenum oxide film 203 and the insulating film 204) even when a semiconductor layer formed by a coating method is used.

The organic transistor may be replaced by a transistor, a semiconductor film of which is formed using ZnO or oxide of zinc gallium indium by a sputtering method or a PLD method. In that case, the structure of FIG. 3A or 3B can be employed. When ZnO or oxide of zinc gallium indium is used for the semiconductor layer, the gate insulating film is preferably formed using oxide including aluminum or titanium. The present invention is also useful in forming a transistor through a process which includes a step of exposing a substrate to plasma as described above. After a transistor is formed over a substrate which can withstand plasma, the transistor can be peeled and transferred to a flexible substrate.

This embodiment mode can be freely combined with Embodiment Mode 1. For example, a liquid crystal display device can be manufactured using the organic transistor described in Embodiment Mode 2 instead of the amorphous TFT described in Embodiment Mode 1. Further, a light emitting device can be manufactured using the amorphous TFT described in Embodiment Mode 1 instead of the organic transistor described in Embodiment Mode 2.

Embodiment Mode 3

An example of manufacturing a passive-matrix light emitting device over a flexible substrate is described here with reference to FIGS. 5A to 9.

In a passive (simple-matrix) light emitting device, a plurality of anodes arranged in stripes (strip-form) are provided perpendicularly to a plurality of cathodes arranged in stripes. A light emitting layer or a fluorescent layer is interposed at each intersection. Therefore, a pixel at an intersection of an anode selected (to which a voltage is applied) and a cathode selected emits light.

FIG. 5A shows a top view of a pixel portion before sealing. FIG. 5B shows a cross-sectional view taken along a dashed line A-A' in FIG. 5A. FIG. 5C shows a cross-sectional view taken along a dashed line B-B'.

A molybdenum film 502, a molybdenum oxide film 503, and an insulating film 504 are stacked over a first substrate 501 similarly to Embodiment Mode 2. A plurality of first electrodes 513 are arranged in stripes at regular intervals over the insulating film 504. A partition 514 having openings each corresponding to a pixel is provided over the first electrodes 513. The partition 514 having openings is formed using an insulating material (a photosensitive or nonphotosensitive organic material (polyimide, acrylic, polyamide, polyimide amide, or benzocyclobutene) or an SOG film (such as a $SiO_x$ film including an alkyl group)). Note that each opening corresponding to a pixel is a light emitting region 521.

A plurality of inversely tapered partitions 522 parallel to each other are provided over the partition 514 having openings to intersect with the first electrodes 513. The inversely tapered partitions 522 are formed by a photolithography method using a positive-type photosensitive resin, of which portion unexposed to light remains as a pattern, and by adjusting the amount of light exposure or the length of development time so that a lower portion of a pattern is etched more.

Figure 6:
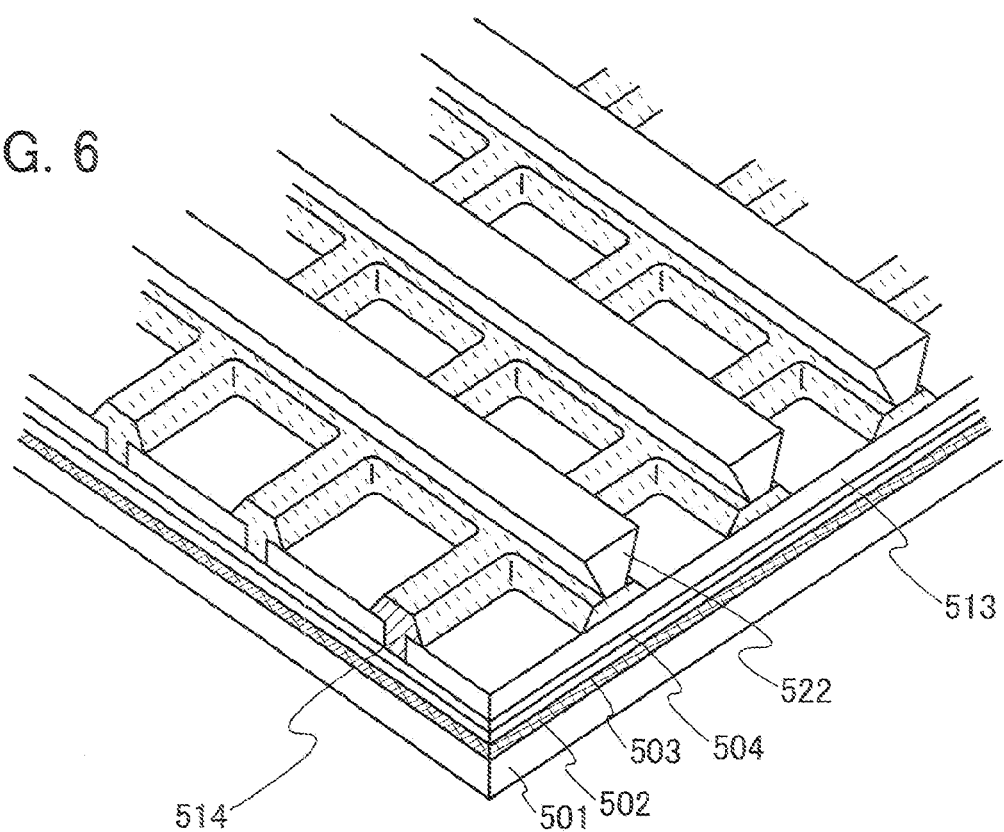
FIG. 6 is a perspective view of a passive-matrix light emitting device (Embodiment Mode 3).

FIG. 6 shows a perspective view immediately after formation of the plurality of inversely tapered partitions 522 parallel to each other. Note that the same reference numerals are used to denote the same portions as those in FIGS. 5A to 5C.

The thickness of each of the inversely tapered partitions 522 is set to be larger than the total thickness of a stacked film including a light emitting layer, and a conductive film. When a stacked film including a light emitting layer, and a conductive film are stacked over the first substrate having the structure shown in FIG. 6, they are separated into a plurality of regions which are electrically isolated from each other, so that stacked films 515R, 515G, and 515B each including a light emitting layer, and second electrodes 516 are formed as shown in FIGS. 5A to 5C. The second electrodes 516 are electrodes in stripe form which are parallel to each other and extend along a direction intersecting with the first electrodes 513. Note that the stacked films each including a light emitting layer and the conductive films are also formed over the inversely tapered partitions 522; however, they are separated from the stacked films 515R, 515G, and 515B each including a light emitting layer and the second electrodes 516.

This embodiment mode describes an example of forming a light emitting device, which provides three kinds of light emission (R, G, B) and is capable of performing full color display, by selectively forming the stacked films 515R, 515G, and 515B each including a light emitting layer. The stacked films 515R, 515G, and 515B each including a light emitting layer are formed into a pattern of stripes parallel to each other.

Alternatively, stacked films each including a light emitting layer which emits light of the same color may be formed over the entire surface to provide monochromatic light emitting elements, so that a light emitting device capable of performing monochromatic display or a light emitting device capable of performing area color display may be provided. Still alternatively, a light emitting device capable of performing full color display may be provided by combining a light emitting device which provides white light emission with color filters.

Figure 7:
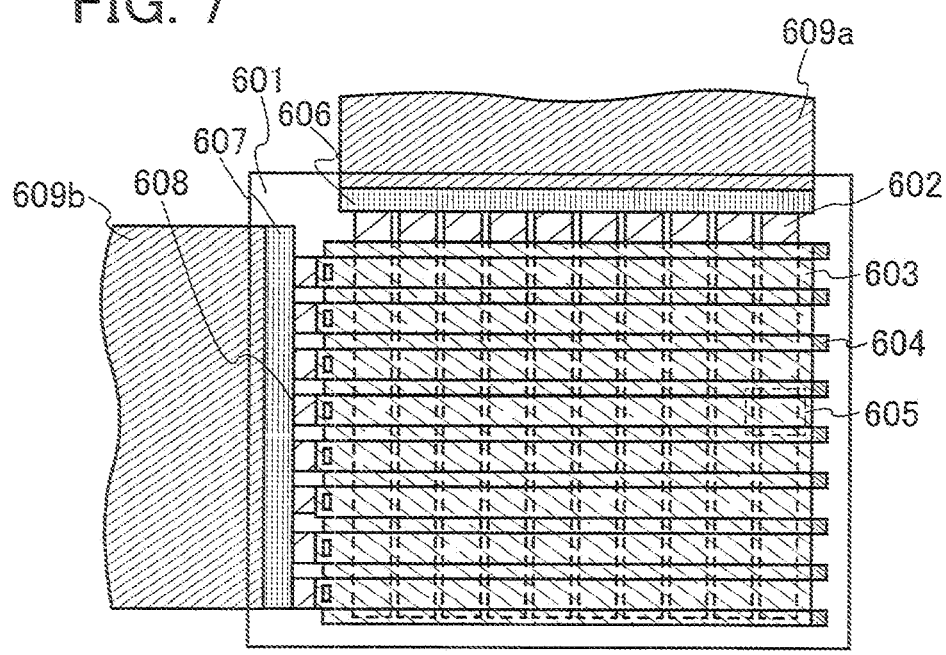
FIG. 7 is a top view of a passive-matrix light emitting device (Embodiment Mode 3).

FIG. 7 shows a top view of a light emitting module mounted with an FPC or the like.

Note that the light emitting device in this specification refers to an image display device, a light emitting device, or a light source (including a lighting system). Further, the light emitting device includes any of the following modules in its category: a module in which a connector such as an FPC (Flexible Printed Circuit), a TAB (Tape Automated Bonding) tape, or a TCP (Tape Carrier Package) is attached to a light emitting device; a module having a TAB tape or a TCP provided with a printed wiring board at the end thereof; and a module having an IC (Integrated Circuit) directly mounted over a light emitting device by a COG (Chip On Glass) method.

In a pixel portion for displaying images, scan lines and data lines intersect with each other perpendicularly as shown in FIG. 7.

The first electrodes 513 in FIGS. 5A to 5C correspond to scan lines 603 in FIG. 7, the second electrodes 516 correspond to data lines 602, and the inversely tapered partitions 522 correspond to partitions 604. Light emitting layers are interposed between the data lines 602 and the scan lines 603, and an intersection portion indicated by a region 605 corresponds to one pixel.

Note that the scan lines 603 are electrically connected at their ends to connection wirings 608, and the connection wirings 608 are connected to an FPC 609b through an input terminal 607. The data lines 602 are connected to an FPC 609a through an input terminal 606.

Then, a first flexible substrate is fixed using a first adhesive layer.

Light emitting elements are peeled from a first substrate 601. A second flexible substrate is then fixed using a second adhesive layer to the side on which the peeling has been caused, in order to seal the light emitting device more firmly.

If necessary, a polarizing plate, a circularly polarizing plate (including an elliptically polarizing plate), a retardation plate (a quarter-wave plate or a half-wave plate), or an optical film such as a color filter may be appropriately provided over a light emitting surface. Further, the polarizing plate or the circularly polarizing plate may be provided with an anti-reflection film. For example, anti-glare treatment may be carried out by which reflected light can be diffused by projections and depressions on the surface so as to reduce the glare.

Through the above-described steps, a flexible passive-matrix light emitting device can be manufactured. An FPC is preferably mounted over a hard substrate because thermocompression bonding is performed at the time of the mounting. According to the present invention, after an FPC is mounted, the light emitting device can be peeled and transferred to a flexible substrate.

FIG. 7 shows an example where a driver circuit is not provided over a substrate. Hereinafter, an example of a method for manufacturing a light emitting module mounted with an IC chip including a driver circuit is described with reference to FIGS. 8A and 8B.

First, a molybdenum film, a molybdenum oxide film, and an insulating film are stacked over a first substrate 701 similarly to Embodiment Mode 2. Over this insulating film, data lines 702 (also functioning as anodes), each of which has a stacked-layer structure of a reflective metal film as a lower layer and a transparent conductive oxide film as an upper layer, are formed. At the same time, connection wirings 708, 709a, and 709b, and input terminals are formed.

Figure 8A:
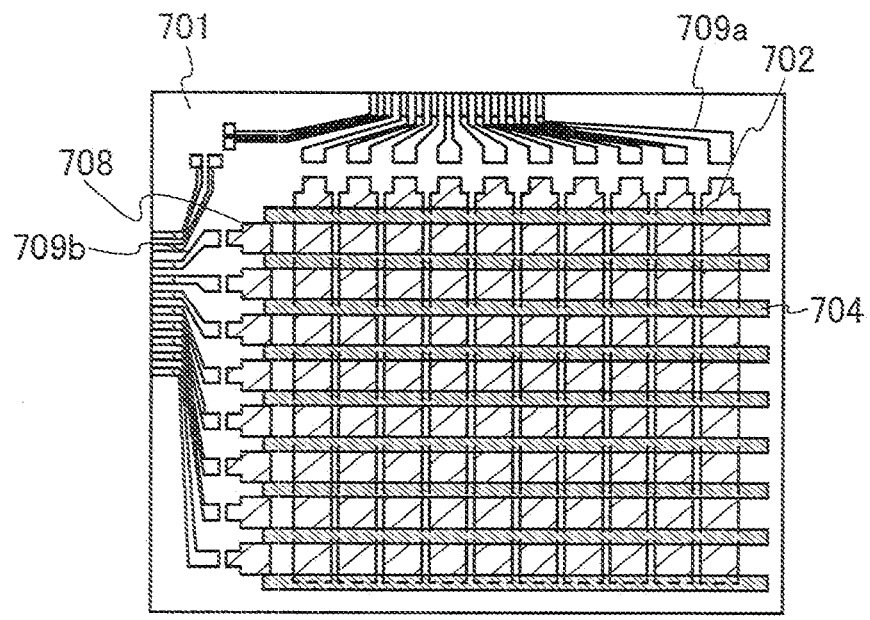
FIGS. 8A and 8B are top views of a passive-matrix light emitting device (Embodiment Mode 3).

Next, a partition having openings each corresponding to a pixel 705 is provided. A plurality of inversely tapered partitions 704 parallel to each other are provided over the partition having openings to intersect with the data lines 702. FIG. 8A shows a top view at a stage where the steps up to here are completed.

Figure 8B:
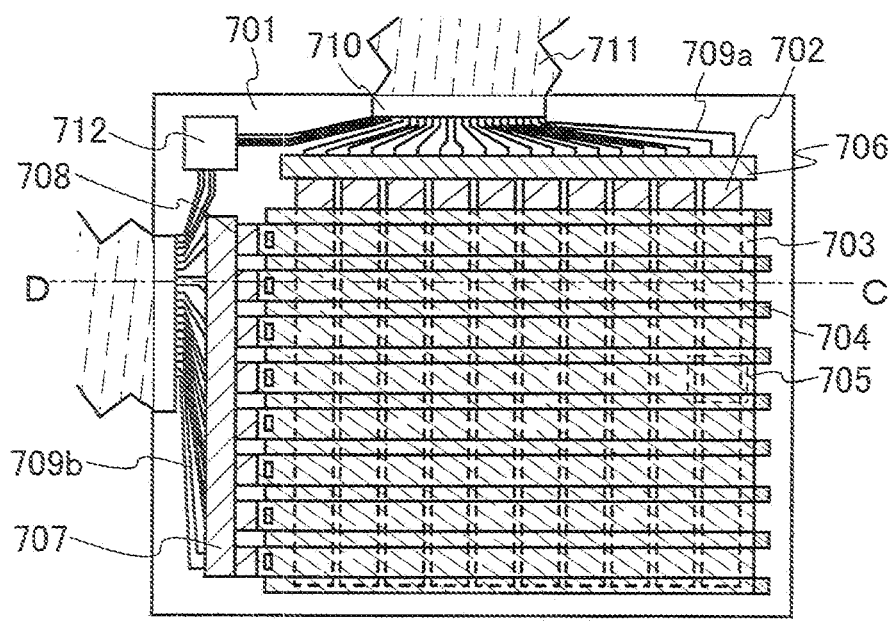

When a stacked film including a light emitting layer, and a transparent conductive film are stacked, they are separated into a plurality of regions which are electrically isolated from each other as shown in FIG. 8B, so that stacked layers each including a light emitting layer, and scan lines 703 made of the transparent conductive film are formed. The scan lines 703 made of the transparent conductive film are electrodes in stripe form which are parallel to each other and extend along a direction intersecting with the data lines 702.

Then, a data line side IC 706 and a scan line side IC 707, in each of which a driver circuit for transmitting a signal to the pixel portion is formed, are mounted on the periphery of (outside) the pixel portion by a COG method. The mounting may be performed using TCP or a wire bonding method other than the COG method. TCP is a TAB tape mounted with an IC, and a TAB tape is connected to a wiring over an element formation substrate and an IC is mounted. Each of the data line side IC 706 and the scan line side IC 707 may be formed using a silicon substrate. Alternatively, it may be that a driver circuit is formed using TFTs over a glass substrate, a quartz substrate, or a plastic substrate. Although described here is an example in which a single IC is provided on one side, a plurality of ICs may be provided on one side.

Note that the scan lines 703 are electrically connected at their ends to the connection wirings 708, and the connection wirings 708 are connected to the scan line side IC 707. This is because it is difficult to provide the scan line side IC 707 over the inversely tapered partitions 704.

The data line side IC 706 provided with the aforementioned structure is connected to an FPC 711 through the connection wirings 709a and an input terminal 710. The scan line side IC 707 is connected to an FPC through the connection wirings 709b and an input terminal.

Further, an IC chip 712 (such as a memory chip, a CPU chip, or a power source circuit chip) is mounted to achieve higher integration.

Next, a first flexible substrate is fixed using a first adhesive layer to cover the pixel portion.

Light emitting elements are peeled from the first substrate 701. Then, a second flexible substrate is fixed using a second adhesive layer to the side on which the peeling has been caused, in order to seal the light emitting device more firmly.

Figure 9:
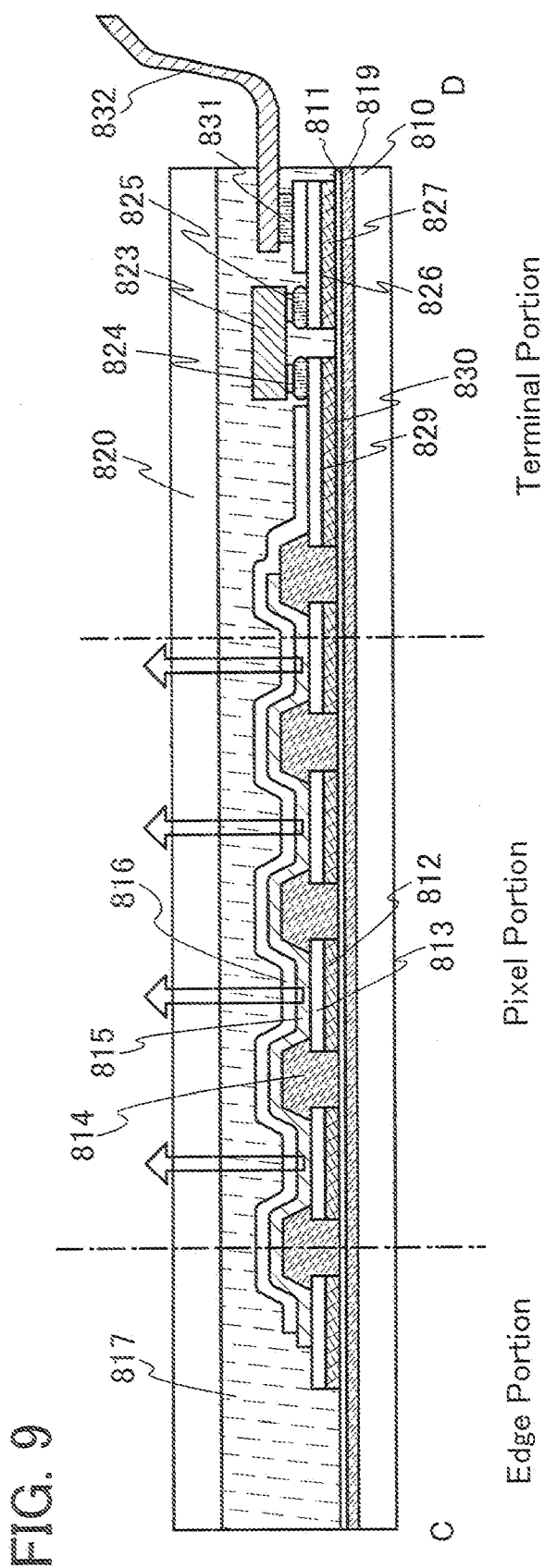
FIG. 9 is a cross-sectional view of a passive-matrix light emitting device (Embodiment Mode 3).

FIG. 9 shows an example of a cross-sectional structure after the second flexible substrate is fixed, which is taken along a dashed line C-D of FIG. 8B.

A base insulating film 811 is provided over a second flexible substrate 810 with a second adhesive layer 819 interposed therebetween. A lower layer 812 is a reflective metal film, and an upper layer 813 is a transparent conductive oxide film. The upper layer 813 is preferably formed using a conductive film having a high work function. For example, it is possible to use a film including a transparent conductive material such as indium tin oxide (ITO), indium tin oxide containing Si elements (ITSO), or IZO (Indium Zinc Oxide) obtained by mixing indium oxide with zinc oxide (ZnO), or a compound of a combination of such conductive materials. The lower layer 812 is formed using Ag, Al, or an Al alloy film.

A partition 814 for insulating between adjacent data lines is made of a resin, and regions surrounded by the partition correspond to and have the same area as light-emitting regions.

Scan lines 816 (cathodes) are formed to intersect with data lines (anodes). The scan lines 816 (cathodes) are formed using a transparent conductive film made of ITO, indium tin oxide containing Si elements (ITSO), or IZO obtained by mixing indium oxide with zinc oxide (ZnO). Since this embodiment mode describes an example of a top-emission light emitting device where light is emitted through a first flexible substrate 820, it is important for the scan lines 816 to be transparent.

A pixel portion, in which a plurality of light emitting elements are arranged at intersections of the scan lines and the data lines with a stacked film 815 including a light emitting layer interposed therebetween, is sealed with the first flexible substrate 820 and filled with a first adhesive layer 817. The first adhesive layer 817 may be formed using an ultraviolet-curing resin, a thermosetting resin, a silicone resin, an epoxy resin, an acrylic rein, a polyimide resin, a phenol resin, PVC (polyvinyl chloride), PVB (polyvinyl butyral), or EVA (ethylene vinyl acetate).

A terminal electrode is formed at an end portion of the second flexible substrate 810, and an FPC (flexible printed circuit) 832 to be connected to an external circuit is attached to this portion. Although the terminal electrode is formed by a stack of a reflective metal film 830, a transparent conductive oxide film 829, and a conductive oxide film extending from the scan line 816, or a stack of a reflective metal film 827 and a transparent conductive oxide film 826, the present invention is not particularly limited to this example.

The FPC 832 can be mounted by a connecting method using an anisotropic conductive material or a metal bump, or a wire bonding method. In FIG. 9, connection is achieved using an anisotropic conductive adhesive material 831.

On the periphery of the pixel portion, an IC chip 823 in which a driver circuit for transmitting a signal to the pixel portion is formed is electrically connected by anisotropic conductive materials 824 and 825. In order to form a pixel portion capable of performing color display, 3072 data lines and 768 scan lines are required for the XGA display class. Such number of the data lines and scan lines are segmented per several blocks at an end portion of the pixel portion and provided with lead wirings, and then gathered in accordance with the pitch of output terminals of ICs.

Through the above-described steps, a light emitting module mounted with an IC chip, which is sealed with the second flexible substrate 810 and the first flexible substrate 820, can be manufactured. An IC chip is preferably mounted over a hard first substrate because thermocompression bonding is performed at the time of the mounting. According to the present invention, after an IC chip is mounted, the light emitting module can be peeled and transferred to a flexible substrate.

Embodiment Mode 4

This embodiment mode describes an example of manufacturing a semiconductor device which functions as a wireless chip. The semiconductor device described in this embodiment mode has the feature of being capable of reading and writing data without contact. Data transmission methods are broadly classified into three categories: an electromagnetic coupling method in which communication is performed by mutual induction with a pair of coils disposed to face each other; an electromagnetic induction method in which communication is performed by an inductive electromagnetic field; and an electric wave method in which communication is performed by using electric waves. Any of these methods may be employed.

An antenna that is used for data transmission can be provided in two ways. One is to provide an antenna over an element substrate provided with a plurality of elements and memory elements, and the other is to provide a terminal portion over an element substrate provided with a plurality of elements and memory elements and connect an antenna provided over another substrate to the terminal portion.

Hereinafter, this embodiment mode describes a manufacturing method in the case of connecting an antenna provided over another substrate to a terminal portion over an element substrate.

Figure 10A:
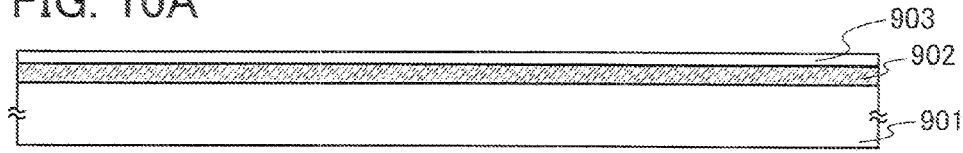
FIGS. 10A to 10D are cross-sectional views showing a manufacturing process of an antenna.

First, a molybdenum film 902 and a molybdenum oxide film 903 are stacked over a heat-resistant substrate 901 similarly to Embodiment Mode 1. FIG. 10A shows a cross-sectional view of the substrate after the steps up to here are completed. A glass substrate is used as the heat-resistant substrate 901. This heat-resistant substrate is not limited to a glass substrate. It is acceptable as long as the substrate withstands a baking temperature (approximately 300° C.) of a conductive layer formed by a coating method and does not change its shape significantly. Note that a plastic substrate with low heat resistance may bend when heat treatment is performed at 300° C. for 30 minutes; therefore, a plastic substrate is unsuitable for the heat-resistant substrate 901.

Figure 10B:
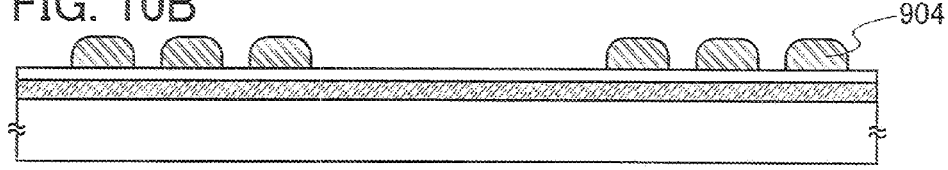

Next, a conductive layer 904 functioning as an antenna is formed over the molybdenum oxide film 903 as shown in FIG. 10B. The conductive layer 904 functioning as an antenna is formed by discharging droplets or a paste including a conductive material such as gold, silver, or copper by a droplet discharge method (such as an ink-jet method or a dispenser method) and drying and baking the droplets or paste. When the conductive layer 904 is formed by a droplet discharge method, the number of steps can be reduced and corresponding cost can also be reduced. Alternatively, the conductive layer 904 may be formed using a screen printing method. In the case of employing a screen printing method, the conductive layer 904 functioning as an antenna is formed by selectively printing a conductive paste in which conductive particles each having a particle size of several nanometers to several tens of micrometers are dissolved or dispersed in an organic resin. As the conductive particle, a fine particle or a dispersive nanoparticle of one or more metals selected from silver (Ag), gold (Au), copper (Cu), nickel (Ni), platinum (Pt), palladium (Pd), tantalum (Ta), molybdenum (Mo), titanium (Ti), and the like or silver halide can be used. In addition, the organic resin included in the conductive paste can be one or more organic resins each functioning as a binder, a solvent, a dispersant, or a coating of the metal particle. Typically, an organic resin such as an epoxy resin or a silicon resin can be used. In forming the conductive layer, baking is preferably performed after the conductive paste is applied. Alternatively, fine particles mainly containing solder or lead-free solder may be used; in this case, it is preferable to use fine particles each having a particle size of 20 μm or less. Solder or lead-free solder has the advantages of low cost and the like. Other than the above-mentioned materials, ceramic, ferrite, or the like may be used for an antenna.

In a case of manufacturing an antenna by a screen printing method or a droplet discharge method, the antenna is formed in a desired shape and then baked. The baking temperature is 200° C. to 300° C. Although the baking is possible at a temperature lower than 200° C., the conductivity of the antenna cannot be secured and the communication distance of the antenna may also be shortened in that case. In view of these points, the antenna is preferably formed over another substrate, that is, a heat-resistant substrate and then peeled and transferred to an element substrate. When a memory element using an organic material is provided over the element substrate, the memory element may change its quality depending on a baking temperature of the antenna, which may affect data writing or the like. In view of this point, it is advantageous to connect an antenna provided over another substrate to a terminal portion of an element substrate.

Alternatively, an antenna may be formed using a gravure printing or the like besides a screen printing method or may be formed using a conductive material by a plating method or the like. Since the antenna formed by a plating method may have poor adhesion depending on a plating material or plating conditions, it is effective to use the peeling method of the present invention in which a molybdenum film is used.

Figure 10C:
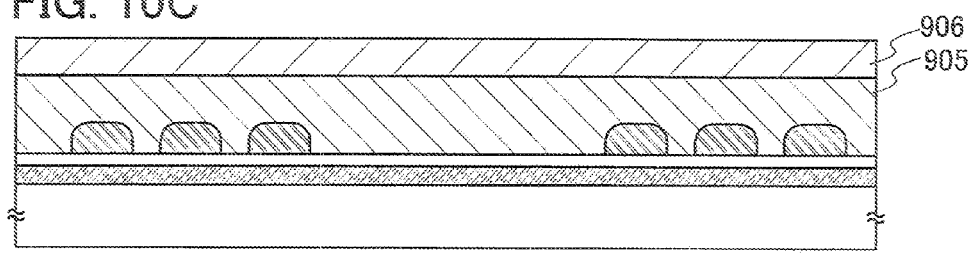

Next, a flexible substrate 906 is attached using a resin layer 905 in order to protect the conductive layer 904 as shown in FIG. 10C.

Figure 10D:
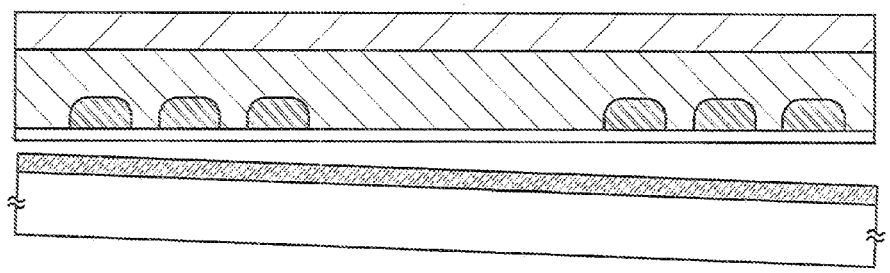

Then, the heat-resistant substrate 901 and the molybdenum film 902 can be peeled and separated from the molybdenum oxide film 903, the conductive layer 904, the resin layer 905, and the flexible substrate 906 as shown in FIG. 10D. Note that the separation may occur in the molybdenum oxide film 903, at the interface between the molybdenum oxide film 903 and the conductive layer 904, or at the interface between the molybdenum oxide film 903 and the resin layer 905. If sufficient adhesion between the flexible substrate 906 and the conductive layer 904 is secured with the resin layer 905, the peeling can be performed by pulling the flexible substrate 906 after the resin layer 905 is fixed. By the peeling method of the present invention in which a molybdenum film is used, the peeling can be performed only by application of relatively weak force, which leads to an increase in yield. Since only relatively weak force is applied in the peeling method of the present invention in which a molybdenum film is used, a change in shape of the flexible substrate 906 at the time of the peeling can be suppressed and damage to the conductive layer 904 can also be reduced.

Figure 10E:
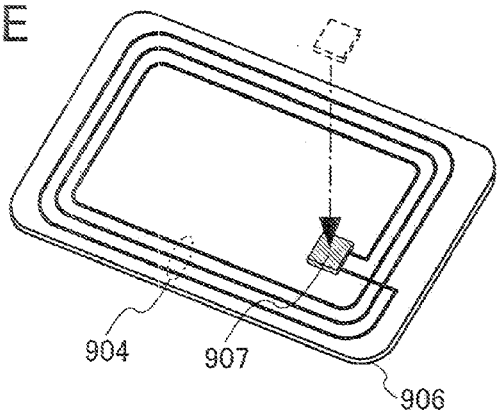
FIG. 10E is a perspective view showing a manufacturing process of a semiconductor device.
Figure 11A:
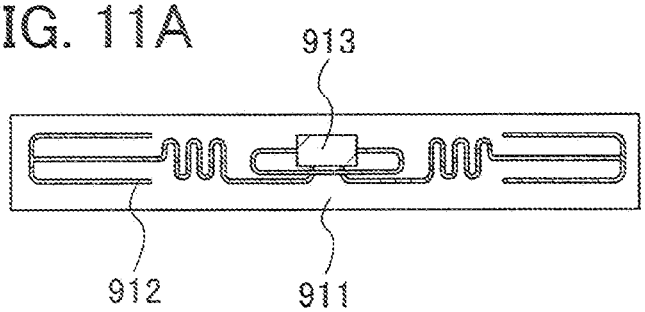
FIGS. 11A to 11D are top views each showing a semiconductor device functioning as a wireless chip.
Figure 11B:
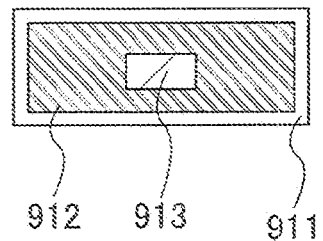
Figure 11C:
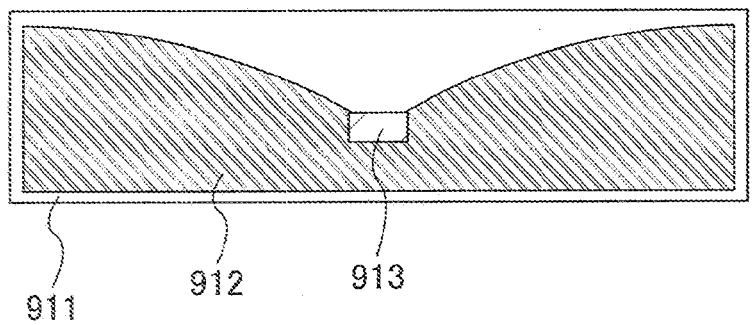
Figure 11D:
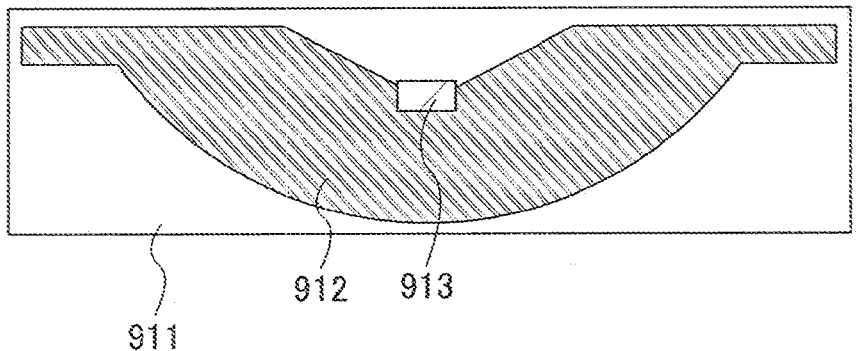

Then, an element substrate 907 is positioned in contact with a side on which the conductive layer 904 is provided as shown in FIG. 10E. Since the molybdenum oxide film 903 also has a characteristic of a semiconductor, electrical connection can be made when a terminal portion of the element substrate is positioned to overlap the conductive layer 904. It is needless to say that electrical connection between the terminal portion of the element substrate and the conductive layer 904 can be made by pressure bonding using an anisotropic conductive material.

FIG. 10E shows an example of providing the element substrate 907 which has a smaller area than the flexible substrate 906; however, there is no particular limitation. An element substrate having approximately the same area as the flexible substrate 906 may be provided, or an element substrate having a larger area than the flexible substrate 906 may be provided.

Lastly, another flexible substrate is attached to cover the antenna and the element substrate 907 for protection; thus, a semiconductor device functioning as a wireless chip is completed. Note that the another flexible substrate may be omitted if not necessary.

Here, an electromagnetic coupling method or an electromagnetic induction method (for example, a 13.56 MHz band) is employed as the signal transmission method in the semiconductor device. In order to utilize electromagnetic induction caused by a change in magnetic field density, the conductive layer functioning as an antenna in FIG. 10E is formed to have an annular shape (for example, a loop antenna) or a spiral shape when seen from above. However, the shape is not particularly limited.

Alternatively, a microwave method (for example, a UHF band (860 to 960 MHz band), a 2.45 GHz band, or the like) can be employed as the signal transmission method in the semiconductor device. In that case, the length, shape, or the like of the conductive layer functioning as an antenna may be appropriately set in consideration of a wavelength of an electromagnetic wave used for signal transmission. Each of FIGS. 11A to 11D shows an example of a conductive layer 912 functioning as an antenna and a chip semiconductor device 913 including an integrated circuit, which are formed over a flexible substrate 911. For example, the conductive layer 912 functioning as an antenna may be formed to have a linear shape (for example, a dipole antenna (see FIG. 11A)), a flat shape (for example, a patch antenna (see FIG. 11B)), or a ribbon shape (see FIG. 11C or 11D) when seen from above. The shape of the conductive layer functioning as an antenna is not limited to a linear shape, and the conductive layer may be formed to have a curved shape, a meander shape, or a combination thereof in consideration of a wavelength of an electromagnetic wave.

Figure 12A:
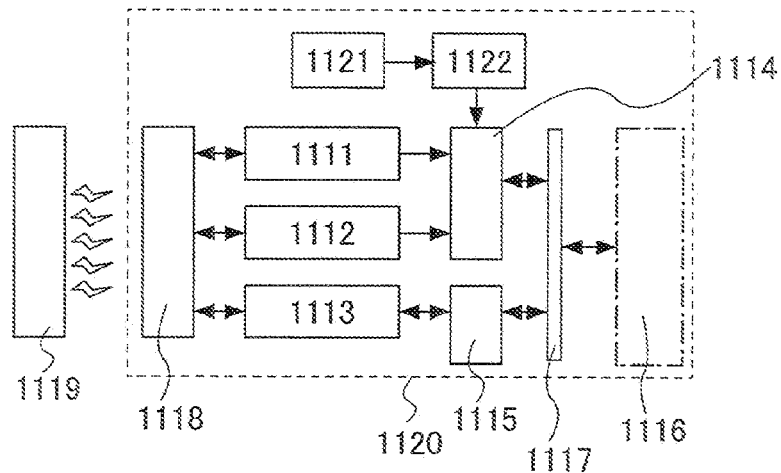
FIG. 12A is a block diagram illustrating a semiconductor device obtained by the present invention.

A structure of the semiconductor device obtained through the above-mentioned steps is described with reference to FIG. 12A. As shown in FIG. 12A, a semiconductor device 1120 obtained according to the present invention functions to exchange data without contact, and includes a power supply circuit 1111, a clock generation circuit 1112, a data demodulation or modulation circuit 1113, a control circuit 1114 which controls another circuit, an interface circuit 1115, a memory circuit 1116, a data bus 1117, an antenna 1118, a sensor 1121, and a sensor circuit 1122.

The power supply circuit 1111 generates various kinds of power to be supplied to circuits in the semiconductor device 1120, based on an AC signal inputted from the antenna 1118. The clock generation circuit 1112 generates various kinds of clock signals to be supplied to circuits in the semiconductor device 1120, based on the AC signal inputted from the antenna 1118. The data demodulation or modulation circuit 1113 functions to demodulate or modulate data to be exchanged with a reader/writer 1119. The control circuit 1114 functions to control the memory circuit 1116. The antenna 1118 functions to transmit and receive an electric wave. The reader/writer 1119 communicates with and controls the semiconductor device, and controls the processing of data thereof. Note that the structure of the semiconductor device is not limited to the above structure. For example, the semiconductor device may be additionally provided with another component such as a limiter circuit of power source voltage or hardware dedicated to cryptographic processing.

A feature of the memory circuit 1116 is to include a memory element in which an organic compound layer or a phase change layer is interposed between a pair of conductive layers. Note that the memory circuit 1116 may include only the memory element in which an organic compound layer or a phase change layer is interposed between a pair of conductive layers or may include a memory circuit having another structure. The memory circuit having another structure corresponds to one or more of, for example, a DRAM, an SRAM, a FeRAM, a mask ROM, a PROM, an EPROM, an EEPROM, and a flash memory.

The sensor 1121 is formed by a semiconductor element such as a resistor element, a capacitive coupling element, an inductive coupling element, a photovoltaic element, a photoelectric conversion element, a thermoelectric element, a transistor, a thermistor, or a diode. The sensor circuit 1122 detects a change of impedance, reactance, inductance, voltage, or current and outputs a signal to the control circuit 1114 after analog-digital conversion (A/D conversion).

This embodiment mode can be freely combined with Embodiment Mode 1 or 2. For example, electrical connection can be made by attachment of a peeled element substrate (flexible substrate) where an integrated circuit is formed using the TFT obtained in Embodiment Mode 1 or 2, and a flexible substrate provided with the antenna obtained in this embodiment mode.

According to the present invention, a semiconductor device functioning as a chip including a processor circuit (hereinafter also referred to as a processor chip, a wireless chip, a wireless processor, a wireless memory, or a wireless tag) can be formed. The application of the semiconductor device obtained by the present invention is wide-ranging. For example, the semiconductor device of the present invention can be used while being provided in paper money, coins, securities, certificates, bearer bonds, packing containers, books, recording media, personal belongings, vehicles, food, clothing, health products, commodities, medicine, electronic devices, and the like.

Figure 13A:
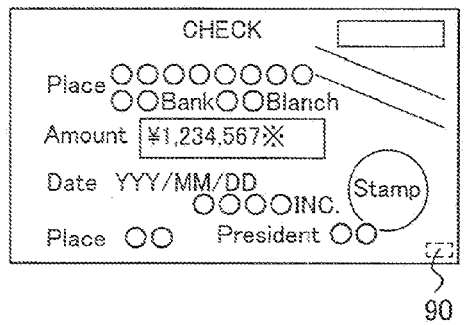
FIGS. 13A to 13G are diagrams each showing an example of a semiconductor device.
Figure 13B:
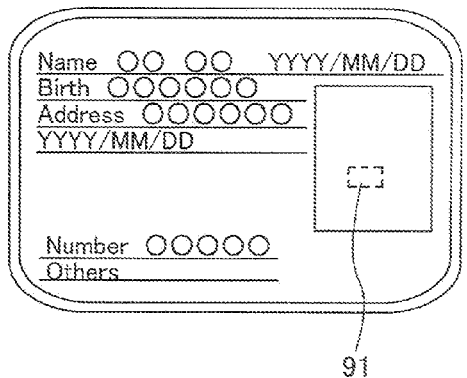
Figure 13C:
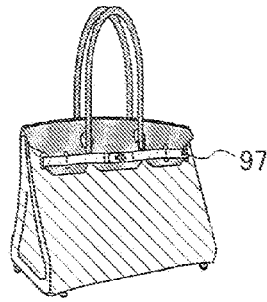
Figure 13D:
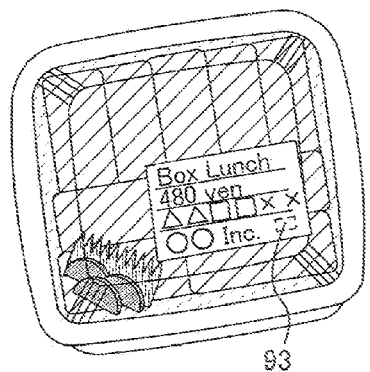
Figure 13E:
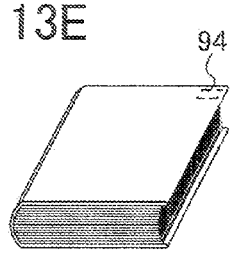
Figure 13F:
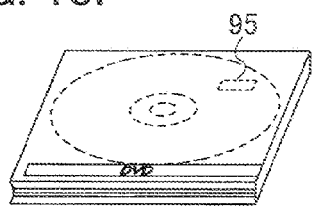
Figure 13G:
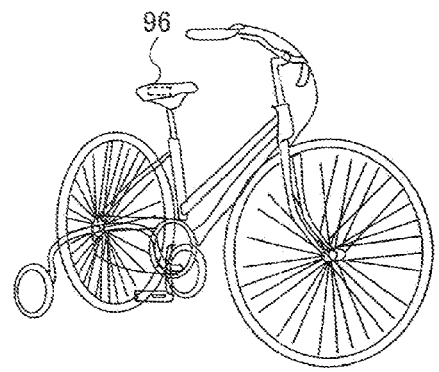

Paper money and coins are money distributed to the market and include ones valid like money in a certain area (cash voucher), memorial coins, and the like. Securities refer to checks, certificates, promissory notes, and the like, and can be provided with a chip 90 including a processor circuit (see FIG. 13A). Certificates refer to driver's licenses, certificates of residence, and the like, and can be provided with a chip 91 including a processor circuit (see FIG. 13B). Personal belongings refer to bags, glasses, and the like, and can be provided with a chip 97 including a processor circuit (see FIG. 13C). Bearer bonds refer to stamps, rice coupons, various gift certificates, and the like. Packing containers refer to wrapping paper for food containers and the like, plastic bottles, and the like, and can be provided with a chip 93 including a processor circuit (see FIG. 13D). Books refer to hardbacks, paperbacks, and the like, and can be provided with a chip 94 including a processor circuit (see FIG. 13E). Recording media refer to DVD software, video tapes, and the like, and can be provided with a chip 95 including a processor circuit (see FIG. 13F). Vehicles refer to wheeled vehicles such as bicycles, ships, and the like, and can be provided with a chip 96 including a processor circuit (see FIG. 13G). Food refers to food articles, drink, and the like. Clothing refers to clothes, footwear, and the like. Health products refer to medical instruments, health instruments, and the like. Commodities refer to furniture, lighting equipment, and the like. Medicine refers to medical products, pesticides, and the like. Electronic devices refer to liquid crystal display devices, EL display devices, television devices (TV sets and thin TV sets), cellular phones, and the like.

The semiconductor device obtained according to the present invention is fixed to an article by being mounted on a printed board, being attached to a surface of the article, being embedded in the article, or the like. For example, the semiconductor device is fixed to an article by being embedded in paper in the case of a book, or by being embedded in an organic resin in the case of a package made of the organic resin. The semiconductor device of the present invention achieves smallness, thinness, and lightness, and therefore does not harm the design of the article itself. In addition, by providing paper money, coins, securities, bearer bonds, certificates, and the like with the semiconductor devices obtained according to the present invention, an authentication function can be provided, and this authentication function can be utilized to prevent falsification. Further, by providing containers for wrapping, recording media, personal belongings, food, clothing, commodities, electronic devices, and the like with the semiconductor device obtained according to the present invention, a system such as an inspection system becomes more efficient.

Figure 12B:
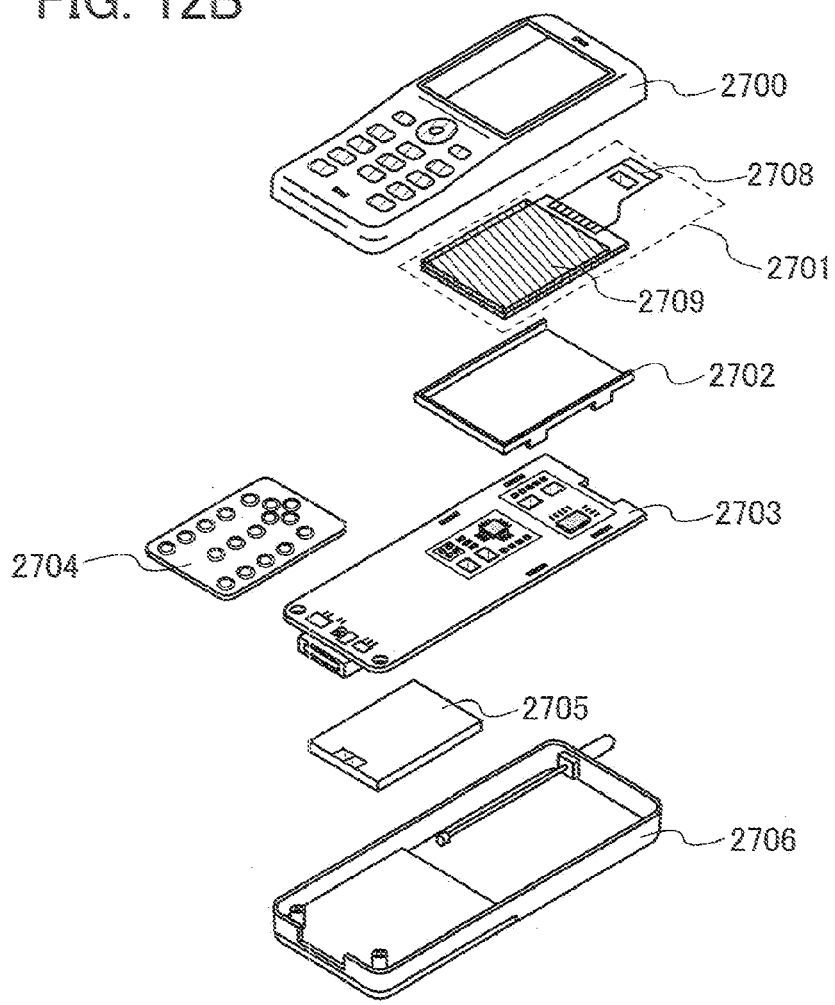
FIG. 12B is a diagram showing an example of an electronic device.

Next, one mode of the electronic device mounted with the semiconductor device obtained according to the present invention is described with reference to a drawing. The electronic device given as an example here is a cellular phone, which includes casings 2700 and 2706, a panel 2701, a housing 2702, a printed wiring board 2703, operation buttons 2704, and a battery 2705 (see FIG. 12B). The panel 2701 is detachably incorporated in the housing 2702, and the housing 2702 is fitted into the printed wiring board 2703. The shape and size of the housing 2702 are changed appropriately in accordance with the electronic device into which the panel 2701 is to be incorporated. On the printed wiring board 2703, a plurality of packaged semiconductor devices are mounted; the semiconductor device obtained according to the present invention can be used as one of the packaged semiconductor devices. The plurality of semiconductor devices mounted on the printed wiring board 2703 have any function of a controller, a central processing unit (CPU), a memory, a power supply circuit, an audio processing circuit, a transmitting/receiving circuit, and the like.

The panel 2701 is connected to the printed wiring board 2703 via a connection film 2708. The above-described panel 2701, housing 2702, and printed wiring board 2703 are contained together with the operation buttons 2704 and the battery 2705, inside the casings 2700 and 2706. A pixel region 2709 in the panel 2701 is provided so as to be viewed through an opening window provided in the casing 2700.

As described above, the semiconductor device obtained according to the present invention has features of being thin and lightweight because a flexible substrate is used. These features make it possible to efficiently use the limited space inside the casings 2700 and 2706 of the electronic device.

The semiconductor device of the present invention includes a memory element with a simple structure in which an organic compound layer is interposed between a pair of conductive layers; therefore, an inexpensive electronic device using the semiconductor device can be provided.

Note that the shapes of the casings 2700 and 2706 are mere examples of exterior shape of the cellular phone; the electronic devices according to this embodiment mode can be changed into various modes in accordance with the function or application.

The present invention with the above-described structure is described more in detail in the following embodiments.

Embodiment 1

The liquid crystal display device or the light emitting device obtained according to the present invention can be used for various modules (such as an active-matrix liquid crystal module, an active-matrix EL module, and an active-matrix electrochromic (EC) module). That is, the present invention can be applied to all electronic devices incorporating them in display portions.

Examples of such electronic devices are as follows: a camera such as a video camera or a digital camera, a head mounted display (goggle type display), a car navigation system, a projector, a car stereo component, a personal computer, a portable information terminal (a mobile computer, a cellular phone, an electronic book, or the like), and the like. Examples thereof are shown in FIGS. 14A to 14C.

Figure 14A:
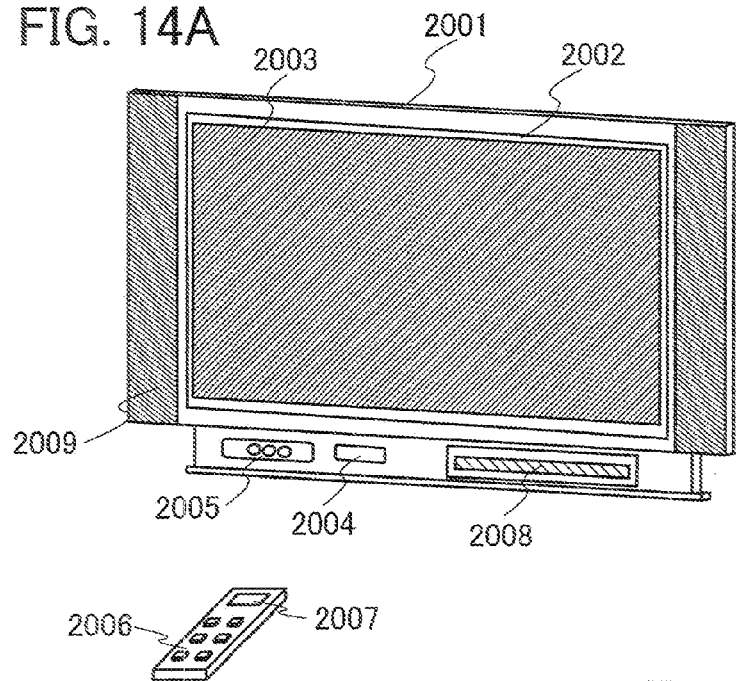
FIGS. 14A to 14C are diagrams each showing an example of an electronic device.
Figure 14B:
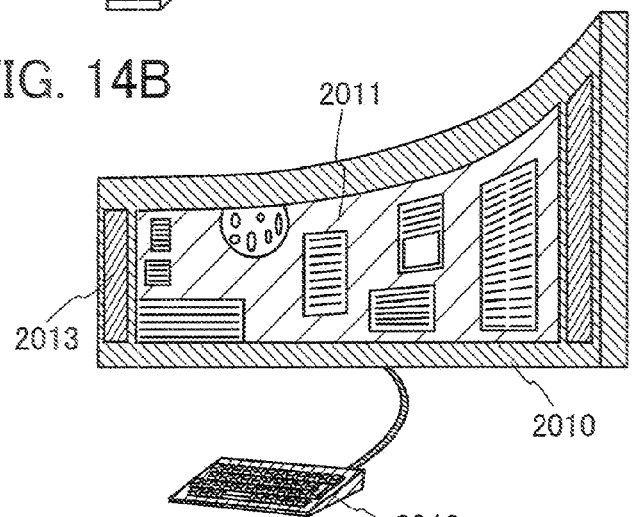
Figure 14C:
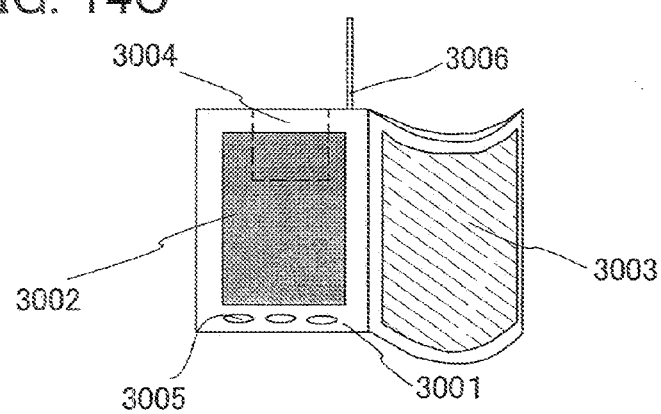
Figure 15A:
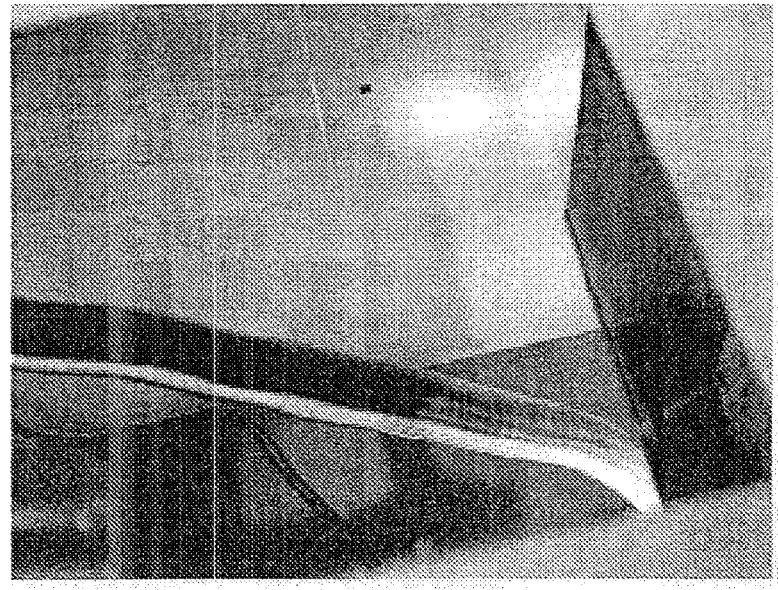
FIGS. 15A and 15B are a photograph and a schematic diagram showing a result of a tape peel test, respectively.
Figure 15B:
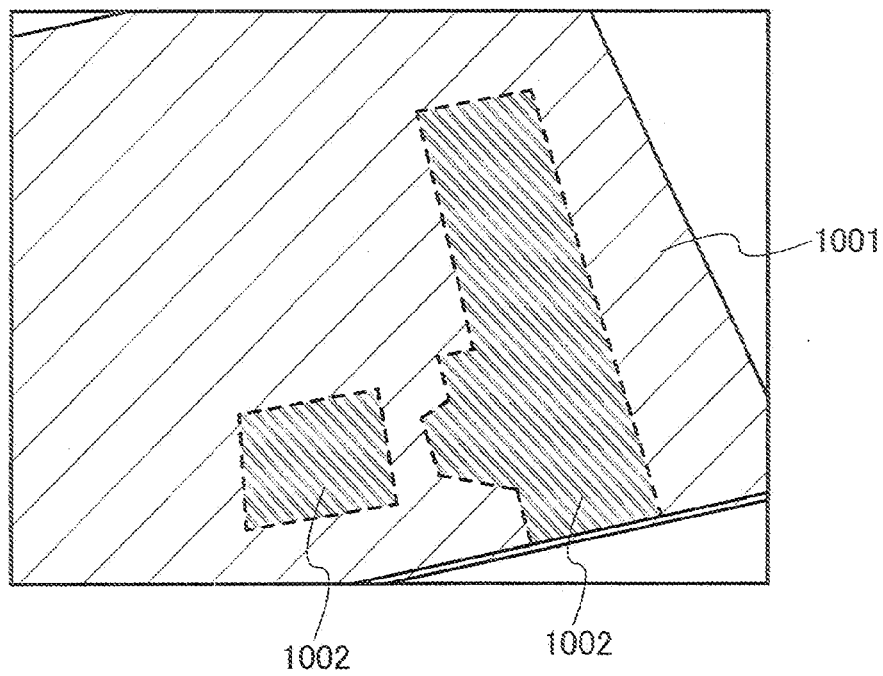
Figure 16A:
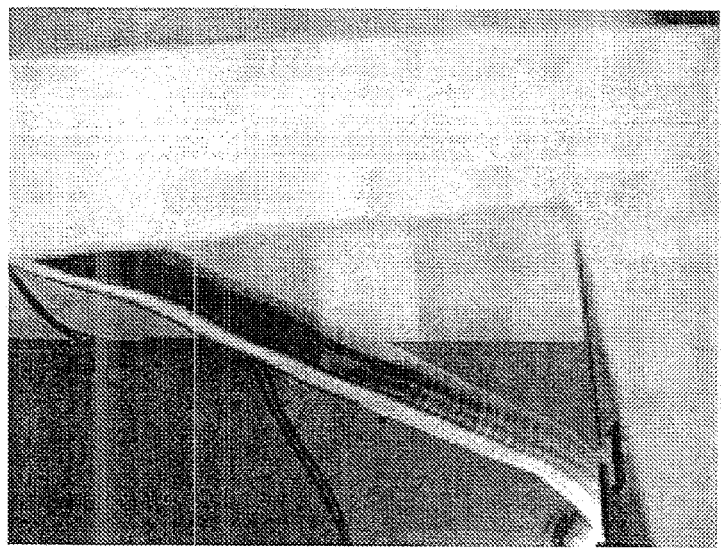
FIGS. 16A and 16B are a photograph and a schematic diagram showing a result of a tape peel test, respectively.
Figure 16B:
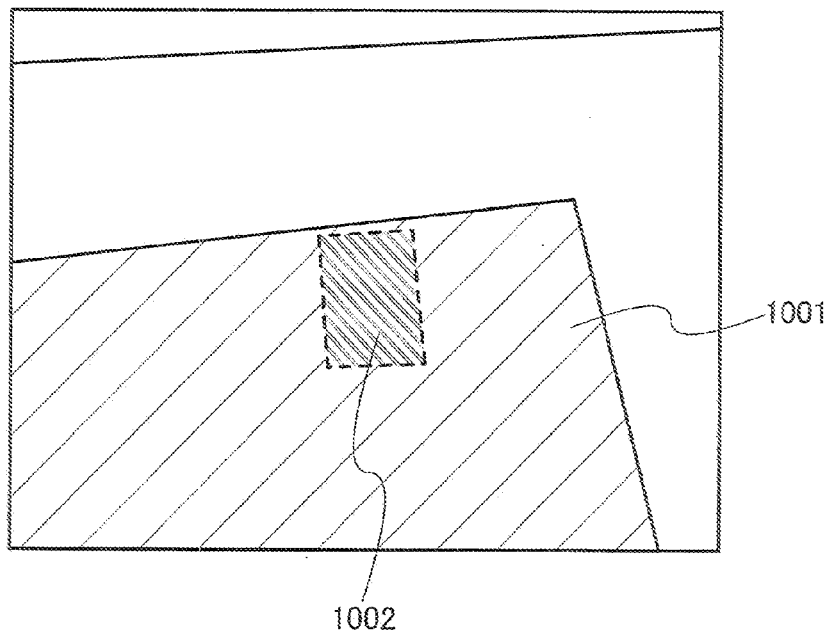

FIGS. 14A and 14B each show a television set. A display panel may employ any of the following modes: a case where only a pixel portion is formed and a scan line side driver circuit and a signal line side driver circuit are mounted by a TAB method; a case where only the pixel portion is formed and the scan line side driver circuit and the signal line side driver circuit are mounted by a COG method; a case where a TFT is formed, the pixel portion and the scan line side driver circuit are formed over the same substrate, and the signal line side driver circuit is separately mounted as a driver IC; a case where the pixel portion, the signal line driver circuit, and the scan line driver circuit are formed over the same substrate; and the like.

As a structure of another external circuit, a video signal amplifier circuit that amplifies a video signal among signals received by a tuner, a video signal processing circuit that converts the signal outputted from the video signal amplifier circuit into a chrominance signal corresponding to each color of red, green, and blue, a control circuit that converts the video signal into a signal which meets the input specification of a driver IC, and the like are provided on an input side of the video signal. The control circuit outputs respective signals to a scan line side and a signal line side. In a case of digital driving, a signal dividing circuit may be provided on the signal line side and an input digital signal may be divided into a plurality of pieces to be supplied.

An audio signal among the signals received by the tuner is transmitted to an audio signal amplifier circuit and the output is supplied to a speaker through an audio signal processing circuit. A control circuit receives control information of a receiving station (reception frequency) or sound volume from an input portion and transmits a signal to the tuner or the audio signal processing circuit.

Such a display module is incorporated in a casing as shown in FIG. 14A or 14B, thereby a television device can be completed. A display panel provided with components up to an FPC is also referred to as a display module. A main screen 2003 is formed using the display module, and a speaker portion 2009, an operation switch, and the like are provided as accessory equipment. In such a manner, a television device can be completed.

As shown in FIG. 14A, a display panel 2002 using a display element is incorporated in a casing 2001, and general TV broadcast can be received by a receiver 2005. Further, by connection to a communication network with or without wires via a modem 2004, one-way (from a sender to a receiver) or two-way (between a sender and a receiver or between receivers) information communication can also be carried out. The television device can be operated by using a switch built in the casing or a remote control unit 2006. This remote control unit 2006 may also be provided with a display portion 2007 for displaying output information.

Further, the television device may include a sub-screen 2008 formed using a second display panel for displaying channels, volume, or the like, in addition to the main screen 2003. In this structure, the main screen 2003 may be formed using an EL display panel having a superior viewing angle, and the sub-screen 2008 may be formed using a liquid crystal display panel capable of displaying images with less power consumption. In order to reduce the power consumption preferentially, the main screen 2003 may be formed using a liquid crystal display panel, and the sub-screen 2008 may be formed using an EL display panel such that the sub-screen can flash on and off.

FIG. 14B shows a television device having a large display portion with a size of, for example, 20 to 80 inches. The television device includes a casing 2010, a display portion 2011, a keyboard portion 2012 that is an operation portion, a speaker portion 2013, and the like. The present invention is applied to the manufacturing of the display portion 2011. The display portion of FIG. 14B is formed using a flexible substrate which can be curved; thus, the television device has a curved display portion. Since the shape of a display portion can be freely designed as described above, a television device having a desired shape can be manufactured.

Since the display device can be formed through a simplified process in accordance with the present invention, a cost reduction can also be achieved. Therefore, the television device using the present invention can be formed at low cost even when formed to have a large-area display portion.

It is needless to say that the present invention is not limited to the television device, and can be applied to various uses as large-area display media such as an information display board at a train station, an airport, or the like, and an advertisement display board on the street, as well as a monitor of a personal computer.

FIG. 14C shows a portable information terminal (electronic book device), which includes a main body 3001, display portions 3002 and 3003, a memory medium 3004, an operating switch 3005, an antenna 3006, and the like. The peeling method of the present invention can be applied to the display portions 3002 and 3003. The weight of the portable information terminal can be reduced by using a flexible substrate. When an antenna is formed over a flat substrate and incorporated instead of the antenna shown in FIG. 14C, the peeling method of the present invention can be employed.

This embodiment can be freely combined with any one of Embodiment Modes 1 to 3.

Embodiment 2

This embodiment describes an example of using an electrophoretic display device as the display portion described in Embodiment 1. Typically, an electrophoretic display device is applied to the display portion 3002 or the display portion 3003 of the portable information terminal (electronic book device) shown in FIG. 14C.

The electrophoretic display device (electrophoretic display) is also called electronic paper and has the advantage of being as easy as paper to be read, and consuming less power and being thinner and lighter in weight than other display devices.

A variety of modes of electrophoretic displays can be considered, but the electrophoresis display of this embodiment is a device in which a plurality of microcapsules each including first particles having a positive charge and second particles having a negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a dye, and does not move in a case where there is no electric field. Also, the first particles have a color which is different from that of the second particles (the particles may also be colorless).

Thus, the electrophoretic display utilizes a so-called dielectrophoretic effect, in which a substance with high dielectric constant moves to a region with high electric field. The electrophoretic display does not require a polarizing plate and an opposite substrate, which are necessary for a liquid crystal display device, so that the thickness and weight thereof are about half.

That which the microcapsules are dispersed in a solvent is called electronic ink, and this electronic ink can be printed on a surface of glass, plastic, fabric, paper, or the like. Color display is also possible with the use of a color filter or particles including a coloring matter.

In addition, a display device can be completed by appropriately providing a plurality of the microcapsules over a substrate to be interposed between two electrodes, and can perform display by application of electric field to the microcapsules. For example, the active-matrix substrate obtained in Embodiment Mode 1 can be used. Although electronic ink can be printed directly over a plastic substrate, it is preferable in a case of the active-matrix type to form an element and electronic ink over a glass substrate, peel the glass substrate, and attach the element and the electronic ink to a plastic substrate that is a flexible substrate according to Embodiment Mode 1 or 2, rather than forming an element over a plastic substrate which is sensitive to heat and an organic solvent. This is because a manufacturing process can be carried out under a wide range of conditions.

Note that the first particles and the second particles in the microcapsule may be formed of one of a conductive material, an insulating material, a semiconductor material, a magnetic material, a liquid crystal material, a ferroelectric material, an electroluminescent material, an electrochromic material, and a magnetophoretic material or a composite material thereof.

This embodiment can be freely combined with any one of Embodiment Modes 1 to 3 and Embodiment 1.

According to the present invention, an element such as a TFT formed using an existing manufacturing apparatus for a large glass substrate can be transferred to a flexible substrate. Therefore, equipment cost can be significantly reduced. In addition, the peeling method of the present invention has almost no limitation on a process; accordingly, various elements can be transferred to a flexible substrate.

This application is based on Japanese Patent Application serial no. 2006-126708 filed in Japan Patent Office on Apr. 28, 2006, the entire contents of which are hereby incorporated by reference.

What is claimed is:

1. A method for manufacturing a semiconductor device, comprising the steps of:
   forming a molybdenum film over a substrate;
   removing an edge portion of the molybdenum film;
   forming a molybdenum oxide film over the molybdenum film;
   forming an insulating film over the molybdenum oxide film;
   forming a passive matrix light emitting element including a first electrode over the insulating film in a stripe form, a light emitting layer over the first electrode, and a second electrode over the light emitting layer in a stripe form perpendicular to the first electrode;
   attaching a flexible printed circuit to the second electrode, the flexible printed circuit being configured to be connected to an external circuit;
   separating the insulating film, the first electrode, the light emitting layer, the second electrode, and the flexible printed circuit from the substrate; and
   disposing the insulating film, the first electrode, the light emitting layer, the second electrode, and the flexible printed circuit over a flexible substrate after separating,
   wherein the step of removing the edge portion of the molybdenum film is performed by dry etching.

2. The method for manufacturing a semiconductor device according to claim 1, wherein the molybdenum film is formed in contact with the substrate.

3. The method for manufacturing a semiconductor device according to claim 1, wherein the molybdenum oxide film is formed in contact with the molybdenum film.

4. The method for manufacturing a semiconductor device according to claim 1, further comprising a step of partially performing laser light irradiation before separating.

5. The method for manufacturing a semiconductor device according to claim 1, wherein the substrate is selected from the group consisting of a glass substrate, a ceramic substrate, and a quartz substrate.

6. The method for manufacturing a semiconductor device according to claim 1, wherein the light emitting layer comprises an organic compound or an inorganic compound.

7. The method for manufacturing a semiconductor device according claim 1, wherein the passive matrix light emitting element is formed through a process at a temperature lower than 500° C.

8. The method for manufacturing a semiconductor device according claim 1, further comprising a step of forming a first partition having an opening over the first electrode and forming a second partition which is inversely tapered and intersects with the first electrode over the first partition before forming the light emitting layer over the first electrode.

9. The method for manufacturing a semiconductor device according claim 8, wherein a thickness of the second partition is larger than a total thickness of the light emitting layer and the second electrode.

10. The method for manufacturing a semiconductor device according to claim 1, further comprising a step of mounting an IC chip before separating.

11. A method for manufacturing a semiconductor device, comprising the steps of:
    forming a molybdenum film over a substrate;
    removing an edge portion of the molybdenum film;
    forming a molybdenum oxide film over the molybdenum film;
    forming an insulating film over the molybdenum oxide film;
    forming a passive matrix light emitting element including a first electrode over the insulating film in a stripe form, a light emitting layer formed over the first electrode by an ink-jet method, and a second electrode over the light emitting layer in a stripe form perpendicular to the first electrode;
    attaching a flexible printed circuit to the second electrode, the flexible printed circuit being configured to be connected to an external circuit;
    separating the insulating film, the first electrode, the light emitting layer, the second electrode, and the flexible printed circuit from the substrate; and
    disposing the insulating film, the first electrode, the light emitting layer, the second electrode, and the flexible printed circuit over a flexible substrate after separating,
    wherein the step of removing the edge portion of the molybdenum film is performed by dry etching.

12. The method for manufacturing a semiconductor device according to claim 11, wherein the molybdenum film is formed in contact with the substrate.

13. The method for manufacturing a semiconductor device according to claim 11, wherein the molybdenum oxide film is formed in contact with the molybdenum film.

14. The method for manufacturing a semiconductor device according to claim 11, further comprising a step of partially performing laser light irradiation before separating.

15. The method for manufacturing a semiconductor device according to claim 11, wherein the substrate is selected from the group consisting of a glass substrate, a ceramic substrate, and a quartz substrate.

16. The method for manufacturing a semiconductor device according to claim 11, wherein the light emitting layer comprises an organic compound or an inorganic compound.

17. The method for manufacturing a semiconductor device according claim 11, wherein the passive matrix light emitting element is formed through a process at a temperature lower than 500° C.

18. The method for manufacturing a semiconductor device according claim 11, further comprising a step of forming a first partition having an opening over the first electrode and forming a second partition which is inversely tapered and intersects with the first electrode over the first partition before forming the light emitting layer over the first electrode.

19. The method for manufacturing a semiconductor device according claim 18, wherein a thickness of the second partition is larger than a total thickness of the light emitting layer and the second electrode.

20. The method for manufacturing a semiconductor device according to claim 11, further comprising a step of mounting an IC chip before separating.

21. A method for manufacturing a semiconductor device, comprising the steps of:
    forming a molybdenum film over a substrate;
    removing an edge portion of the molybdenum film;
    forming a molybdenum oxide film over the molybdenum film;
    forming an insulating film over the molybdenum oxide film;
    forming a passive matrix light emitting element including a first electrode over the insulating film in a stripe form, a light emitting layer over the first electrode, and a second electrode over the light emitting layer in a stripe form perpendicular to the first electrode;
    attaching a flexible printed circuit to the second electrode, the flexible printed circuit being configured to be connected to an external circuit;
    disposing a first flexible substrate over the second electrode and the flexible printed circuit;
    separating the insulating film, the first electrode, the light emitting layer, the second electrode, the flexible printed circuit, and the first flexible substrate from the substrate after disposing the first flexible substrate; and
    disposing the insulating film, the first electrode, the light emitting layer, the second electrode, the flexible printed circuit, and the first flexible substrate over a second flexible substrate after separating,
    wherein the step of removing the edge portion of the molybdenum film is performed by dry etching.

22. The method for manufacturing a semiconductor device according to claim 21, wherein the molybdenum film is formed in contact with the substrate.

23. The method for manufacturing a semiconductor device according to claim 21, wherein the molybdenum oxide film is formed in contact with the molybdenum film.

24. The method for manufacturing a semiconductor device according to claim 21, further comprising a step of partially performing laser light irradiation before separating.

25. The method for manufacturing a semiconductor device according to claim 21, wherein the substrate is selected from the group consisting of a glass substrate, a ceramic substrate, and a quartz substrate.

26. The method for manufacturing a semiconductor device according to claim 21, wherein the light emitting layer comprises an organic compound or an inorganic compound.

27. The method for manufacturing a semiconductor device according claim 21, wherein the passive matrix light emitting element is formed through a process at a temperature lower than 500° C.

28. The method for manufacturing a semiconductor device according claim 21, further comprising a step of forming a first partition having an opening over the first electrode and forming a second partition which is inversely tapered and intersects with the first electrode over the first partition before forming the light emitting layer over the first electrode.

29. The method for manufacturing a semiconductor device according claim 28, wherein a thickness of the second partition is larger than a total thickness of the light emitting layer and the second electrode.

30. The method for manufacturing a semiconductor device according to claim 21, further comprising a step of mounting an IC chip before separating.

31. A method for manufacturing a semiconductor device, comprising the steps of:
    forming a metal film over a substrate;
    removing an edge portion of the metal film by dry etching;
    forming a metal oxide film over the metal film;
    forming an insulating film over the metal oxide film;
    forming a display element;
    separating the insulating film and the display element from the substrate; and
    disposing the insulating film and the display element over a first flexible substrate after separating.

32. The method for manufacturing a semiconductor device according to claim 31, wherein the substrate is a glass substrate, a ceramic substrate, a quartz substrate, or a semiconductor substrate.

33. The method for manufacturing a semiconductor device according to claim 31, wherein the metal film is a molybdenum film.

34. The method for manufacturing a semiconductor device according to claim 31, wherein the metal oxide film is a molybdenum oxide film.

35. The method for manufacturing a semiconductor device according to claim 31, wherein the display element includes a transistor having a semiconductor film formed using oxide of zinc gallium indium.

36. The method for manufacturing a semiconductor device according to claim 31, wherein the display element is sealed with a second flexible substrate and filled with an adhesive layer.

37. The method for manufacturing a semiconductor device according to claim 31, wherein the display element is a passive matrix liquid crystal display element, a passive matrix light emitting element, an active matrix liquid crystal display element, or an active matrix light emitting element.

38. The method for manufacturing a semiconductor device according to claim 31, further comprising the step of:
    irradiating a part of the substrate with laser light before separating.

* * * * *